US012187822B2

(12) United States Patent
Vaughn et al.

(10) Patent No.: US 12,187,822 B2
(45) Date of Patent: Jan. 7, 2025

(54) METHODS AND COMPOSITIONS FOR PHOTOPOLYMERIZABLE ADDITIVE MANUFACTURING

(71) Applicant: POLY-MED, INC., Anderson, SC (US)

(72) Inventors: Michael Aaron Vaughn, Anderson, SC (US); Prabhjot Saini, Greenville, SC (US)

(73) Assignee: POLY-MED, INC., Anderson, SC (US)

( * ) Notice: Subject to any disclaimer, the term of this patent is extended or adjusted under 35 U.S.C. 154(b) by 1126 days.

(21) Appl. No.: 17/045,672

(22) PCT Filed: Apr. 5, 2019

(86) PCT No.: PCT/US2019/026114
§ 371 (c)(1),
(2) Date: Oct. 6, 2020

(87) PCT Pub. No.: WO2019/195763
PCT Pub. Date: Oct. 10, 2019

(65) Prior Publication Data
US 2021/0155722 A1 May 27, 2021

Related U.S. Application Data

(60) Provisional application No. 62/653,584, filed on Apr. 6, 2018.

(51) Int. Cl.
C08F 2/50 (2006.01)
B29C 64/129 (2017.01)
B33Y 10/00 (2015.01)
B33Y 70/00 (2020.01)
C08F 222/10 (2006.01)
C08K 3/32 (2006.01)
C08K 5/07 (2006.01)
C08K 5/5313 (2006.01)
G03F 7/00 (2006.01)

(52) U.S. Cl.
CPC ............ C08F 2/50 (2013.01); B29C 64/129 (2017.08); B33Y 10/00 (2014.12); B33Y 70/00 (2014.12); C08F 222/102 (2020.02); C08K 3/32 (2013.01); C08K 5/07 (2013.01); C08K 5/5313 (2013.01); G03F 7/0037 (2013.01); C08K 2003/325 (2013.01)

(58) Field of Classification Search
CPC ...... G03F 7/0275; G03F 7/0037; G03F 7/029; G03F 7/027; G03F 7/0047; G03F 7/031; B33Y 10/00; B33Y 70/00; B29C 64/129; B29C 64/124; B29C 64/112; C08K 5/07; C08K 5/5313; C08K 3/32; C08K 2003/325; C08F 2/44; C08F 222/102; C08F 2/50
See application file for complete search history.

(56) References Cited

U.S. PATENT DOCUMENTS

| 4,223,040 | A | 9/1980 | Carroll |
| 5,744,148 | A | 4/1998 | Habif et al. |
| 6,083,524 | A | 7/2000 | Sawhney et al. |
| 6,200,646 | B1 | 3/2001 | Neckers et al. |
| RE38,721 | E | 4/2005 | Jensen et al. |
| RE38,722 | E | 4/2005 | Jensen et al. |
| 8,629,192 | B2 | 1/2014 | Merrigan et al. |
| 8,821,559 | B2 | 9/2014 | Dimauro et al. |
| 8,851,649 | B2 | 10/2014 | Engel et al. |
| 9,205,601 | B2 * | 12/2015 | DeSimone ............ G03F 7/0037 |
| 10,696,563 | B2 | 6/2020 | Yoshida et al. |
| 2003/0166726 | A1 | 9/2003 | Bechtel et al. |
| 2003/0207204 | A1 | 11/2003 | Sugasaki et al. |
| 2004/0152800 | A1 | 8/2004 | Shalaby et al. |
| 2005/0149158 | A1 | 7/2005 | Hunter et al. |
| 2005/0175925 | A1 | 8/2005 | Johnson et al. |
| 2006/0240063 | A9 | 10/2006 | Hunter et al. |
| 2010/0068839 | A1 * | 3/2010 | Ray ........................ H01L 21/30 257/E31.127 |
| 2016/0177026 | A1 | 6/2016 | Gray et al. |
| 2016/0347624 | A1 | 12/2016 | Yoshida et al. |
| 2017/0150714 | A1 | 6/2017 | Schwartz |
| 2018/0079923 | A1 | 3/2018 | Umebayashi |
| 2019/0010259 | A1 | 1/2019 | Iwata et al. |
| 2020/0123326 | A1 | 4/2020 | Park et al. |

FOREIGN PATENT DOCUMENTS

| CN | 1185942 | A | 7/1998 |
| CN | 102005532 | A | 4/2011 |
| CN | 105122135 | A | 12/2015 |
| CN | 105960379 | A | 9/2016 |
| JP | H07033844 | A | 2/1995 |
| JP | H10859444 | A | 3/1996 |
| JP | 2001213908 | A | 8/2001 |
| JP | 2003246851 | A | 9/2003 |
| JP | 2003277423 | A | 10/2003 |
| JP | 2004-514778 | A | 5/2004 |
| JP | 2009532511 | A | 9/2009 |
| JP | 2010508428 | A | 3/2010 |

(Continued)

OTHER PUBLICATIONS

Extended European Search Report issued Nov. 12, 2021 in EP Application 19781362.
Takao et al. "Preparation of cross-linked aliphatic polyester and application to thermo-responsive material," Journal of Controlled Release, 1994, 32(1), 87-96.
Extended European Search Report mailed Nov. 2, 2023 in European Application 23183272.6 (8 pages).
International Search Report and Written Opinion dated Jun. 28, 2019, for International Application No. PCT/US2019/026114.

Primary Examiner — Monica A Huson
Assistant Examiner — Kelsey C Grace
(74) Attorney, Agent, or Firm — Meunier Carlin & Curfman LLC

(57) ABSTRACT

The present disclosure is directed to methods and compositions comprising photopolymerizable compositions for use in additive manufacturing, particularly for digital light processing, stereolithography or continuous liquid interface processing.

18 Claims, No Drawings

(56) References Cited

FOREIGN PATENT DOCUMENTS

| | | |
|---|---|---|
| JP | 2012-139542 A | 7/2012 |
| JP | 2013018920 A | 1/2013 |
| JP | 2016527382 A | 9/2016 |
| KR | 101822151 B1 | 1/2018 |
| WO | 0244276 A2 | 6/2002 |
| WO | 2006031388 A2 | 3/2006 |
| WO | 2007096708 A2 | 8/2007 |
| WO | 2008055666 A1 | 5/2008 |
| WO | 2013146081 A1 | 10/2013 |
| WO | 2014126837 A2 | 8/2014 |
| WO | 2015021254 A1 | 2/2015 |
| WO | 2016199611 A1 | 12/2016 |
| WO | 2017079158 A1 | 5/2017 |
| WO | 2019204061 A1 | 10/2019 |

\* cited by examiner

METHODS AND COMPOSITIONS FOR PHOTOPOLYMERIZABLE ADDITIVE MANUFACTURING

CROSS-REFERENCE TO RELATED APPLICATION

This application is a national phase application under 35 U.S.C. § 371 of International Application No. PCT/US2019/026114, filed Apr. 5, 2019, which claims the benefit under 35 U.S.C. § 119 (e) of U.S. Provisional Patent Application No. 62/653,584 filed Apr. 6, 2018; which applications are herein incorporated by reference in their entireties for all purposes.

FIELD OF THE INVENTION

The present disclosure is directed to methods and compositions for photopolymerizable additive manufacturing, particularly manufacturing employing UV and visible light photopolymerizable components.

BACKGROUND OF THE INVENTION

One of the more widely used methods of photopolymerizable additive manufacturing is stereolithography (SLA) for three-dimensional (3-D) printing. In stereolithography (SLA) methods, light, such as ultraviolet (UV) or visible light, is used to photopolymerize liquid material into designed structures, such as 3-D articles, with high accuracy and precision. Thin successive layers are photocrosslinked by UV or visible light, for example, under the direction of a sliced CAD (computer aided design) model. Other types of photopolymerizable 3-D printing have been developed and will continue to be developed and used for additive manufacturing.

SLA generally uses a liquid photocrosslinkable polymeric composition, that may be referred to as a resin or an ink formulation, that generally comprises a photopolymerizable polymeric or oligomeric component and photoinitiator. Other components such as diluents, crosslinkers, and dyes are optionally added to compositions. The macroscopic properties and degradation profiles of articles produced by photopolymerization can be modified by varying the polymer chemistry and the processing techniques. For example, biodegradable polymer material may be used to produce articles that have a limited time function, and after a time, are no longer present. Such biodegradable articles are suitable in medical devices, for example, for tissue repair, so that after a time, none of the article is present and tissue repair is accomplished. SLA may also comprise non-biodegradable polymer material used in methods to provide longer-lasting articles.

Concerns for photopolymerized articles that come in contact with living entities, i.e., subjects, include those regarding the safety and efficacy of the produced articles, particularly biocompatibility and cytotoxicity. There exists a need for improved methods and compositions for 3-D printing methods and compositions that result in articles that have high biocompatibility and/or low cytotoxicity.

BRIEF SUMMARY OF THE INVENTION

Disclosed herein are methods and compositions for photopolymerization processes, such as additive manufacturing, often referred to as 3-D printing, and for making and using such photopolymerized articles. Disclosed herein is a method for photopolymerization manufacture (printing) of an article comprising, a) exposing for a time with light, a photopolymerizable composition comprising at least one photopolymerizable macromer component; at least one light reflective material component comprising a light reflective material suspended in the photopolymerizable composition; and at least one photoinitiator component; wherein the light reflective material component modulates the light dose of the photopolymerizable composition when compared to the light dose of the photopolymerizable composition without the light reflective material; and forming a printed article comprising at least the polymerized macromers. Disclosed herein is a polymer polymerized by one or more methods disclosed herein. Disclosed herein is an article produced by one or more methods disclosed herein. Disclosed herein is a nontoxic polymeric article, comprising photopolymerized biodegradable polymers and a nontoxic amount of photoinitiator. A polymeric article may be biodegradable, in whole or in part, under physiological conditions. A polymeric article may not be biodegradable, under physiological conditions.

Disclosed herein is a photopolymerizable composition, comprising at least one photopolymerizable macromer component; at least one light reflective material component comprising a light reflective material suspended in the photopolymerizable composition; and at least one photoinitiator component. Compositions disclosed herein may have a light reflective material component that modulates the light dose of the photopolymerizable composition when compared to the light dose of the photopolymerizable composition without the light reflective material. Disclosed herein is a stereolithography photopolymerizable composition, comprising at least one photopolymerizable macromer component; at least one light reflective material component comprising a light reflective material suspended in the photopolymerizable composition; and at least one photoinitiator component; wherein the light reflective material component modulates the light dose of the photopolymerizable composition when compared to the light dose of the photopolymerizable composition without the light reflective material. Disclosed herein is a continuous liquid interface production photopolymerizable composition, comprising at least one photopolymerizable macromer component; at least one light reflective material component comprising a light reflective material suspended in the photopolymerizable composition; and at least one photoinitiator component; wherein the light reflective material component modulates the light dose of the photopolymerizable composition when compared to the light dose of the photopolymerizable composition without the light reflective material.

Disclosed herein is a photopolymerizable ink composition, comprising, at least one photopolymerizable macromer component; at least one light reflective material component comprising a light reflective material suspended in the photopolymerizable composition; at least one photoinitiator component; wherein the light reflective material component modulates the light dose of the photopolymerizable composition when compared to the light dose of the photopolymerizable composition without the light reflective material; a reactive diluent; and a stabilizer. Compositions disclosed herein may comprise a dye. Disclosed herein is a light reflective material, comprising, at least one of an inorganic solid; an organic compound, a crystalline organic compound, a crystalline amino acid and/or its derivative, a crystalline fatty acids and/or its derivative, a crystalline peptide, or combinations thereof. The present disclosure comprises methods of making disclosed compositions.

DETAILED DESCRIPTION

Disclosed herein are methods and compositions comprising at least one reflective material that modulates the effective light dose of photopolymerizable compositions. Disclosed herein are methods for photopolymerizable manufacture (printing) of an article comprising, exposing for a time with light, a photopolymerizable composition comprising at least one photopolymerizable macromer component; at least one light reflective material component suspended in the photopolymerizable composition; and at least one photoinitiator component, wherein the light reflective material component modulates the light dose of the photopolymerizable composition when compared to the photopolymerizable composition without the light reflective material; and forming a printed article comprising polymerized macromers. In an aspect, the light reflective material component enhances the light dose for a formulation that contains the light reflective material component. Enhancing the light dose for a formulation may allow using a lower amount of photoinitiator in the formulation while still polymerizing the polymerizable components at the same rate or a substantially similar rate of polymerization, or in some instances, a higher rate of polymerization. In an aspect, the photoinitiator component may be in a total concentration of less than 1.0 wt %. In an aspect, compositions disclosed herein comprise a light reflective material component that provides an increased polymerization rate at the surface of a photopolymerizable composition where the light contacts the photopolymerizable composition in comparison to the same photopolymerizable composition without the light reflective material component. In an aspect, incorporation of a light reflective material component into a photopolymerizable composition provides a surface cure of the macromer at a lower concentration of photoinitiator than the concentration used in the photopolymerizable composition without the light reflective material component. In an aspect, a light reflective material component reflects light in one or more wavelengths that activate the photoinitiator.

Light is electromagnetic radiation of wavelengths, and those wavelengths to which the human eye is sensitive ($\lambda$ equals approximately 400 to 770 nm), are often referred to as visible light. However, sometimes the word light is also used to refer to other nearby regions of the spectrum: ultraviolet (shorter wavelengths than visible light) and infrared (longer wavelengths). As used herein, "light" refers to electromagnetic radiation of wavelengths including ultraviolet, infra-red and visible wavelengths. Known delineations are that UV (ultraviolet) radiation has wavelengths of approximately 10 to 400 nm, with UVA at 315-400 nm, UV-B at 280 to 315 nm, UV-C at 100-280 nm, and visible to the human eye light (VIS) is 400-770 nm. Infra-red light has wavelengths of approximately 770 to $1 \times 10^6$. Light in the spectra from 10 to 770 nm may be referred to herein as "UV-VIS" light, or "light".

Radiation consists of different wavelength components, although the term "monochromatic" is often used when the spectral range is narrow. Not even a single photon can be assigned an exact wavelength. As radiation also travels in various directions, it is also always associated with a distribution of directions. "Collimated radiation", means that the angular distribution is very narrow. "Scattered or 'diffuse' radiation", means that the angular distribution is wide. In order to fully describe radiation, both the distribution of its wavelength components (the spectral distribution) and their direction in addition to "amount" is considered. In SLA methods, the direction of the light (radiation) is generally fixed and contacts the photopolymerizable material at a direct angle, generally ninety degrees. Other photopolymerization steps, such as secondary curing, may use light sources at different angles.

Two variables for photopolymerization methods and compositions are energy density and power density. Energy density is energy/surface area, often in joules or millijoules per square centimeter ($J/cm^2$ or $mJ/cm^2$). The energy density value generally means the total amount of energy required to activate all photoinitiators within the UV/Vis curable resin to sufficiently polymerize the resin. The total energy required to sufficiently cure a UV curable resin is a function of several components of the photopolymerization method and composition, and changes to those components. Such components include cure thickness, photoinitiator concentration, photoinitiator structure, amount of material to react, specific chemical functionality, and others. A photopolymerization method or composition can have a defined or determined (e.g., measured) energy density required to sufficiently polymerize the photopolymerizable composition, when the method/composition components (cure thickness or depth, photoinitiator concentration, amount of material to react, specific macromers, and others) are held constant. A process specification or technical data sheet can specify the UV source radiation with the energy density requirement, for example the energy density requirement is 500 $mJ/cm^2$ using a 365 nm UV LED source.

A second variable, power density, is used when determining the rate at which radiation (UV/Vis light) is supplied to the photocurable resin (e.g., photopolymerizable composition). The rate at which radiation is supplied to the UV/Vis curable resin correlates with the rate at which photoinitiators absorb UV/Vis radiation to initiate the monomer or macromer polymerization. In use, peak irradiance is often interchangeable with power density with both using units of power/surface area, often watts or milliwatts per square centimeter ($W/cm^2$ or $mW/cm^2$). By definition, peak irradiance is the highest power density applied to the UV/Vis curable resin while power density is generally considered the average irradiance applied to the UV/Vis curable resin.

The relationship between energy density and power density concerns the total exposure time at a specific irradiance combined to give the total amount of energy supplied to the UV curable resin. (Peak Irradiance×Exposure=energy density) This implies that the power density and exposure time are not independent. A watt is a composite unit of joules per second (J/s) and multiplying watts by seconds yields joules, as in $mW/cm^2 \times seconds = mJ/cm^2$.

Once the energy density requirement for a composition is determined, photopolymerization can be controlled by altering the time and/or the power density. For example, if a UV/Vis curable resin has an energy density requirement of 500 $mJ/cm^2$ using a 365 nm UV LED source, the energy requirement can be met under several different exposure periods: a 50 second exposure with a 10 $mW/cm^2$ power density, a 5 second exposure with a 100 $mW/cm^2$ power density, 0.1 second exposure with a 5000 $mW/cm^2$ power density, or any other time-power combination whose product is 500 $mJ/cm^2$.

As used herein, the energy density requirement for a composition is equivalent to light dose and refers to the measured amount of light, the energy per surface area, that is required to activate the photoinitiators within the curable resin to sufficiently polymerize the resin in a particular time, and is measured in $J/cm^2$ or $mJ/cm^2$. The energy density or light dose requirement of a composition is dependent upon components of the composition (photoinitiator concentration, amount of material, photopolymerizable macromers) and the conditions of the photopolymerization method, such as the cure depth or thickness, the distance from the light source, the light source radiation ($mW/cm^2$), and the time it takes for sufficient polymerization to occur. As used herein, a light dose may be expressed as $mJ/cm^2$ ($mJ/cm^2=1,000$ $\mu W/cm^2$ per second) and takes into account the time for polymerization of the exposed photopolymerizable composition. For example, in a stereolithography device, a 365 nm source of light may emit 3 $mW/cm^2$ on a photopolymerizable composition (irradiance) at a fixed distance in the device between the radiation source and the photopolymerizable composition, and the photopolymerizable composition will photopolymerize in a time period of 10 seconds, to yield a light dose (exposure time to sufficiently polymerize the material) of 0.3 $mJ/cm^2$, for that material to be sufficiently photopolymerized in the SLA device. Other photopolymerizing devices have similar conditions for depth of exposure of the light in the photopolymerizable formulation.

Different photopolymerizable materials require different light dose exposures to photopolymerize. For example, irradiance of 3 $mW/cm^2$ for 5 seconds (a light dose of 0.8 $mJ/cm^2$) results in Material A sufficiently photopolymerizing in the five seconds of exposure to the 3 $mW/cm^2$ radiation source, whereas Material B may require 10 seconds of irradiance at 3 $mW/cm^2$ radiation (a light dose equal to 0.3 $mJ/cm^2$) to sufficiently photopolymerize. The light dose (exposure time to polymerize) requirement of Material B is higher than the effective light dose (exposure time to polymerize) requirement of Material A.

The light dose (exposure time to sufficiently polymerize the material), which may also be referred to herein as the light dose requirement (of the composition) may be modulated, increased or decreased, in one aspect, by altering the components of the photopolymerizable composition to cause the photopolymerizable composition to sufficiently photopolymerize in time of exposure that is different from that of the material without alteration. For example, Material B is determined to have an effective light dose requirement of 0.3 $mJ/cm^2$ to sufficiently polymerize in a SLA device with a particular light source. If the components of Material B are altered to form Altered Material B, the light dose requirement of Altered Material B can be determined by keeping the radiation source at the same distance, keeping the radiation or irradiance constant, for example 3 $mW/cm^2$, and determining the time for sufficient polymerization by Altered Material B. For example, with one or more changes to Material B, the light dose requirement changes from Material B's light dose of 0.3 $mJ/cm^2$ to Altered Material B's light dose of 0.8 $mJ/cm^2$, wherein all other components of the reaction (photopolymerizable composition and polymerization conditions) are held constant in measuring the light dose requirements of Material B and Altered Material B. Altered Material B has a higher light dose requirement than does Material B. Disclosed herein are compositions and methods that modulate the light dose requirements of photopolymerizable compositions, wherein other components of the reaction are held constant. In an aspect, photopolymerizable compositions disclosed herein comprise a light reflective material component or a light reflective material that modulates the light dose requirement of the photopolymerizable composition when compared to the composition without the light reflective material component or a light reflective material.

The light dose requirement may be modulated by several factors. One factor is reduced or increased amounts of photoinitiator. Increasing the amount of photoinitiator in a composition generally leads to increased polymerization rate of the macromers. For example, in SLA printing, the time for exposure to the UV/VIS light may be reduced by increasing the photoinitiator amount to result in faster photopolymerization of the macromers in the resin or ink photocurable composition. Additionally, the time for exposure to the UV/VIS light may be increased by decreasing the photoinitiator amount to result in slower photopolymerization of the macromers in the resin or ink photocurable composition.

In addition to photoinitiators, dyes may be added to disclosed photopolymerizable printing formulations. The addition of dyes can be added with the purpose of tailoring a formulation to a desired color. However, dyes for nontoxic and biocompatible formulations are typically used at concentrations of 2 wt. % or less (for example, see PCT/US2016/059910, which is incorporated herein for its teaching of polymerizable compositions and use of dyes). In the case of absorbable devices, most dyes have been regulated by the FDA to contain 0.1-0.3 wt % as shown in the D&C Violet additive for most absorbable suture products. The combination of high dye concentrations and high photoinitiator concentrations provide much of the pronounced toxicity of currently-used 3-D photoprintable formulations containing them, and particularly the resulting photoprinted articles.

In an aspect, the present disclosure provides photopolymerization methods and photopolymerizable compositions having low concentrations of photoinitiator yet photopolymerizing at a faster rate than expected for the low concentration of photointiator. For example, the light dose requirement of a photopolymerizable composition having a low concentration of photoinitiator is modulated by the addition to the photopolymerizable composition of at least one light reflective component. Photopolymerizable compositions disclosed herein comprise at least one light reflective material component and low concentrations of photoinitiator yet photopolymerize at a higher rate than expected for the low concentration of photoinitiator. For example, when compared to a photopolymerizable composition having a low photoinitiator concentration, a disclosed photopolymerizable composition having at least one light reflective material component will photopolymerize at a faster rate than does the composition without the light reflective material component. Though not wishing to be bound by any particular theory, it is believed that a light reflective material component reflects light wavelengths and at least some of the light wavelengths are absorbed by at least one photoinitiator present in the photopolymerizable composition so that either more photoinitiator units are activated or that photoinitiator units are activated multiple times.

In a SLA device, as in other photopolymerization devices, the depth of the material to be photopolymerized is generally held constant. For example, in a SLA device, wherein layer upon layer of material is photopolymerized, "sufficiently polymerized" refers to a particular layer of material that is exposed to the light source and is photopolymerized to a desired extent. The terms "sufficiently polymerized" and "polymerized" may be used interchangeably, and mean that the desired amount of polymerization has taken place, and does not necessarily mean that all polymerizable polymers have been polymerized completely. Sufficiently polymerized is well understood by those of skill in the art. Sufficiently polymerized can include fully or completely polymerized material as well as partially polymerized material. Sufficiently polymerized, in this case, is thus similar to sufficient surface curing of the photopolymerizable composition when bulk composition is exposed to a light source.

The shape of an article also affects the measurements used for incident light striking a target. For light striking a flat surface, irradiance, i.e., radiation power incident on a flat surface of unit area, is used. For shaped targets, energy fluence rate, i.e., radiation power incident on a sphere of unit cross section, captures the curved aspects of the target. The term energy fluence rate may also be referred to as the fluence rate. Other terms with the same meaning as energy fluence rate are space irradiance, scalar irradiance and actinic flux. The latter is used mostly by atmospheric scientists. Both irradiance and energy fluence rate, can also be described in terms of photons. When giving a value for irradiance, the direction of the plane for which the irradiance is considered must be specified. This is often the horizontal plane but will depend on the object studied. For collimated radiation (coming from a single direction), irradiance and fluence rate have the same numerical value if the beam of radiation is perpendicular to the plane on which irradiance is measured. For completely isotropic radiation coming from above (equally from any direction above the horizontal) the fluence rate is twice the irradiance on a horizontal plane. When a delimited beam of radiation hits a plane surface perpendicularly, it results in the irradiance, E, but the same beam when tilted at an angle to the vertical will be more spread out, and thus the irradiance will be lower. For a review, see Beyond the Visible, a handbook of best practice in plant UV photobiology, edited by Pedro Aphalo, published by COST, European Cooperation in Science and Technology, 2012, available on-line. Further discussion of energy density and power density in UV curable materials is found at Polymer Innovation Blog by Jeffrey Gotro.

Compositions

In an aspect, compositions of the present disclosure comprise formulations that are photopolymerizable, for example, such formulations may be effective for additive manufacture methods (3-D printing) including, but not limited to, stereolithography, digital light processing (DLP), injection based printing, inkjet, or continuous photopolymerization methods and devices. In an aspect, a disclosed composition is a photopolymerizable composition, comprising at least one photopolymerizable macromer component; at least one light reflective material component suspended in the photopolymerizable composition; and at least one photoinitiator component, for example, the photoinitiator may be in a total concentration of less than 1.0 wt %. In an aspect, the light reflective material provides a modulated light dose requirement to the photopolymerizable composition when compared to the photopolymerizable composition without the light reflective material. In an aspect, photopolymerizable compositions disclosed herein comprise a light reflective material component that provides an increased polymerization rate at the surface of a photopolymerizable composition where the light contacts the photopolymerizable composition in comparison to the same photopolymerizable composition without the light reflective material component. In an aspect, incorporation of a light reflective material component into a photopolymerizable composition provides a surface cure of the macromer at a lower concentration of photoinitiator than the concentration used in the photopolymerizable composition without the light reflective material component. In an aspect, a photopolymerizable composition is a stereolithography composition. As used herein, a light reflective material component may comprise a light reflective material in addition to other materials (e.g., a diluent or general viscosity modifier) or may be a light reflective material.

Disclosed herein are photopolymerizable compositions comprising at least one photopolymerizable macromer component; at least one light reflective material component comprising a light reflective material suspended in the composition; and at least one photoinitiator component, wherein the light reflective material component provides a modulated light dose requirement to the photopolymerizable composition when compared to the photopolymerizable composition without the light reflective material. In an aspect, a photopolymerizable composition further comprises a reactive diluent. In an aspect, a photopolymerizable composition further comprises a nonreactive diluent. In an aspect, a photopolymerizable composition further comprises a reactive or nonreactive viscosity modifier to increase the viscosity. In an aspect, a photopolymerizable composition further comprises a stabilizer. In an aspect, a stabilizer is a free radical stabilizer. In an aspect, a light reflective material component comprises a particulate light reflective material. In an aspect, a light reflective material component comprises light reflective material that reflects UV light, visible light or both. In an aspect, a light reflective material component comprises light reflective material that reflects UV light, visible light or both, in a wavelength that is absorbed by at least one of the photoinitiators in the photopolymerizable composition.

Disclosed compositions herein may comprise an active agent. In an aspect, a light reflective material component comprises an active agent. In an aspect, a light reflective material is an active agent. For example, a light reflective material component may comprise a light reflective material and an active agent, and optionally other materials such as diluents, solvents, dispersants, etc. In an aspect, a photopolymerizable macromer component comprises an active agent. In an aspect, a photopolymerizable macromer comprises an active agent. In an aspect, a reactive diluent comprises an active agent. In an aspect, a nonreactive diluent comprises an active agent. In an aspect, a photopolymerizable composition comprises a dye.

Disclosed compositions herein comprise a photopolymerizable macromer component comprising macromers (polymers) capable of being photopolymerized. In an aspect, a macromer component comprises monomers and is capable of being photopolymerized. Disclosed compositions herein comprise a photopolymerizable macromer component comprising macromers (polymers) capable of being photopolymerized that are biodegradable or absorbable under physiological conditions. Disclosed compositions herein comprise a photopolymerizable macromer component comprising macromers (polymers) capable of being photopolymerized that are not biodegradable or absorbable under physiological conditions. In an aspect, a photopolymerizable macromer component comprises aliphatic or aromatic macromers, polymers and/or oligomers with ethylenically unsaturated end groups. For example, a photopolymerizable macromer component comprises polymers with acrylate end groups. In an aspect, an acrylate end group may be a methacrylate end group. In an aspect, a photopolymerizable macromer comprises light reactive functional end groups, for example, acrylate or methacrylate. In an aspect, a photopolymerizable macromer comprises light reactive functional end groups, for example, thiol groups. In an aspect, a photopolymerizable composition may comprise one or more macromers with light reactive end groups, wherein the light reactive functional end groups, for example, may be acrylate or methacrylate, thiols, or combinations of macromers having different end groups, e.g., some of which have acrylate end groups and some of which have thiol end groups. In an aspect, a photopolymerizable macromer component may comprise one or more macromers disclosed in U.S. Provisional Patent Application Ser. No. 62/660,146, entitled MACROMERS AND COMPOSITIONS FOR PHOTO- CURING PROCESSES, filed Apr. 19, 2018, by Applicant Poly-Med, Inc., having inventors M. A. Vaughn and P. Saini, and in the concurrently filed PCT Application, serial no. PCT/US2019/026098, entitled MACROMERS AND COMPOSITIONS FOR PHOTOCURING PROCESSES, filed Apr. 5, 2019, by Applicant Poly-Med, Inc., having inventors M. A. Vaughn and P. Saini, each of which is herein incorporated in its entirety.

In an aspect, a macromer may comprise a monofunctional, difunctional, trifunctional, tetrafunctional, or pentafunctional photocurable macromer, and in some cases, can comprise a relatively low molecular weight species or a relatively high molecular weight species. In an aspect, a macromer may comprise reactive groups including, but not limited to, the unsaturated functionality of acrylate (including methacrylates), allyl and vinyl-based reactive groups, and thiol reactive groups. Higher functional materials with 4, 5, 6, up to 18 reactive sites are contemplated in the present disclosure. Monomeric materials will typically have molecular weights less than 250 Daltons while oligomeric materials could have molecular weights into the tens of thousands.

In an aspect, the photopolymerization macromer component is a multi-arm compound comprising a polyaxial central core (CC) and 2-4 arms of the formula (A)-(B) or the formula (B)-(A) extending from the central core, where at least one of the arms comprise a light-reactive functional group (Q). In the multi-arm compound, (A) is the polymerization product of monomers selected from trimethylene carbonate (also referred to herein as T, or as TMC) and ε-caprolactone (also referred to herein as caprolactone, or C, or CAP), while (B) is the polymerization product of monomers selected from glycolide, lactide and p-dioxanone. The light-reactive functional group Q group is photopolymerizable. In one embodiment, exemplary Q groups may contain a thiol group which is photopolymerizable. In one embodiment, exemplary Q groups may contain a carbon-carbon double bond which is photopolymerizable, e.g., the Q group may comprise a vinyl group such as present in an acrylate or methylacrylate group, each having a photopolymerizable carbon-carbon double bond.

Such multi-arm compounds may be prepared from the corresponding multi-arm compound having a hydroxyl group in lieu of the Q group, and then that hydroxyl group undergoes a reaction to introduce a Q group. For example, to convert a hydroxyl group to a Q group containing a photopolymerizable carbon-carbon double bond, a multi-arm compound having one or more terminal hydroxyl groups may be reacted with a reactive acrylate or methacrylate compound, such as methacrylic anhydride, acrylic anhydride, methacryloyl chloride, or acryloyl chloride. As another example, to convert a hydroxyl group to a Q group containing a photopolymerizable thiol group, a multi-arm compound having one or more terminal hydroxyl groups may undergo an esterification reaction. One method for esterification is to add stoichiometric amounts of hydroxyl-terminated macromer and a mercapto carboxyl acid compound in the presence of a carbodiimide (e.g., N,N'-dicyclohexylcarbodiimide) and a catalyst (e.g., dimethylaminopyridine). Exemplary mercapto carboxyl acids include, but are not limited to, the following compounds: 3-mercaptopropionic acid, thiolactic acid, thioglycolic acid, mercaptobutyric acid, mercaptohexanoic acid, mercaptobenzoic acid, mercaptoundecanoic acid, mercaptooctanoic acid, and n-acetyl cysteine. For example, a multi-arm compound having a terminal hydroxyl group as disclosed herein may be reacted with thiolactic acid, in which case the resulting Q group has the formula $-C(=O)-CH_2-SH$ attached to the terminal oxygen of the multi-arm compound.

In an aspect, the multi-arm compound may be represented by the formula CC-[arm-Q]$_n$, where CC represents the central core and n is selected from a number within the ranges of 2-18, or 2-14, or 2-8, or 2-6, or 2-4. Each arm is formed by the polymerization of monomers selected from two groups, the two groups being denoted as group A and group B. Thus, more specifically, in the multi-arm compounds, CC-[arm]$_n$ may be written as either CC-[(A)p-(B)q-Q]n, or CC-[(B)q-(A)p-Q]n where each of (A)p-(B)q and (B)q-(A)p represents an arm. Optionally, the terminal functional group of the arm may be shown, where Q generally represents a photopolymerizable functional group, optionally a terminal photopolymerizable functional group. In the formula, A represents the polymerization product of one or more monomers comprising, and optionally selected only from, trimethylene carbonate (T) and caprolactone (C), and p represents the number of monomers that have been polymerized to form the polymerization product A, where p is selected from 1-40, or 1-30, or 1-20, or 1-10. In the formula, B represents the polymerization product of one or more monomers comprising, and optionally selected only from, glycolide (G), lactide (L) and p-dioxanone (D), and q represents the number of monomers that have been polymerized to form the polymerization product B, where q is selected from 1-40, or 1-30, or 1-20, or 1-10.

In aspects, the present disclosure provides a multi-arm photopolymerizable macromere compound, and compositions containing such compounds, wherein the compound is described by one of: the compound is or comprises a structure CC-[A-B-Q]n and n is 2; the compound is or comprises a structure CC-[A-B-Q]n and n is 3; the compound is or comprises a structure CC-[A-B-Q]n and n is 4; the compound is or comprises a structure CC-[B-A-Q]n and n is 2; the compound is or comprises a structure CC-[B-A-Q]n and n is 3; the compound is or comprises a structure CC-[B-A-Q]n and n is 4. Optionally, the compound has four arms, a molecular mass of less than 40,000 g/mol, or less than 20,000 g/mol, and is a solid at room temperature. Optionally, the compound has three arms, a molecular mass of less than 15,000 g/mol, and is a liquid at room temperature. Optionally, the compound has two arms, a molecular mass of less than 5,000 g/mol, and is a liquid at room temperature. Optionally, the photopolymerizable multi-arm compounds have relatively short arms, e.g., 1-10 monomer residues/arm. Optionally, the photopolymerizable multi-arm compounds may be described by one or more of the following features which characterize the A region (also referred to as a block) of the compound: have a block A which comprises residues formed from trimethylene carbonate (TMC or T); have a block A which comprises residues formed from caprolactone (CAP or C); have a block A which comprises residues formed from both TMC and CAP; at least 90% of the residues in block A are residues formed from TMC or CAP; the compound comprises 1-45, or 2-45 residues formed from TMC; the compound comprises 1-15 or 2-15 residues formed from TMC; the compound comprises 1-10 or 2-10 residues formed from TMC; region A has a molecular weight of from 102-2500 g/mol; region A has a molecular weight of 102-1000 g/mol; region A has a molecular weight of 102-900 g/mol; each A region comprises 2-45 monomer residues; each A region comprises 2-15 monomer residues; each A region comprises 2-10 monomer residues. Optionally, the photopolymerizable multi-arm compounds may be described by one or more of the following features which characterize the B block (also referred to as a region) of the compound: each B block comprise 1-45 or 2-45 monomer residues; each B block comprise 1-15 or 2-15 monomer residues; each B block comprises 1-10 or 2-10 monomer residues. Features describing the A block and features describing the B block may be combined to describe multi-arm photopolymerizable macromere compounds of the present disclosure. The compounds may also, or alternatively, be described by one or more of the following: the compound has a molecular mass of less than 40,000 g/mol; the compound has a molecular mass of less than 25,000 g/mol; the compound has a molecular mass of less than 10,000 g/mol.

In any of the multi-arm photopolymerizable compounds and composition as described herein, Q may be a carbon-carbon double bond, e.g., a vinyl group. Exemplary vinyl groups are an acrylate group and a methacrylate group. In additional aspects, the photopolymerizable compound having one or more Q groups undergoes photopolymerization when exposed to light having a wavelength of 300-450 nm, or 300-425 nm, or 350-450 nm, or 350-425 nm, or 365-405 nm, as examples. In one embodiment, the compound and composition undergoes photopolymerization when exposed to UV radiation.

In any of the multi-arm photopolymerizable compounds and composition as described herein, Q may be a thiol group. In additional aspects, the photopolymerizable compound having one or more Q groups undergoes photopolymerization when exposed to light having a wavelength of 300-450 nm, or 300-425 nm, or 350-450 nm, or 350-425 nm, or 365-405 nm, as examples. In one embodiment, the compound and composition undergoes photopolymerization when exposed to UV radiation.

In general, thiol free radical polymerizations using a photoinitiator require a much higher concentration of photoinitiator than is needed when the Q group has a photopolymerizable carbon-carbon double bond. With thiol groups, the photoinitiator can initiate the thiol groups but two thiol groups can only polymerize when two thiyl radicals meet. Additionally, the joining of two thiyl radicals is a termination of the radical groups which is why a high concentration of photoinitiator is required. When the photopolymerizable group is or comprises a carbon-carbon double bond, e.g., a vinyl group, one free radical can initiate and propagate a large number of vinyl groups before termination. Accordingly, when photopolymerization proceeds through thiol groups, it is beneficial to have a relatively high density of thiol groups. The lower the concentration of thiol end groups the less probability of both the creation of thiyl radicals and the joining of two thiyl radicals for the polymerization to occur. From this perspective, low molecular weight (i.e. preferably <5000 Da, more preferably <3000 Da, and even more preferably <2000 Da) multi-arm thiol compounds are preferable for the photopolymerization processes of the present disclosure.

In an aspect, the present disclosure provides a light-curable composition comprising one or more photopolymerizable macromer compounds, the composition further comprising a photoinitiator and a light reflective material component comprising a light reflective material suspended in the composition; where the photopolymerizable macromer compound is a multi-arm compound comprising a central core (CC) and 2-4 arms extending from the central core, where at least one of the arms comprises a photopolymerizable group (Q) and a block copolymer comprising blocks A and B; wherein block A comprises residues formed from, i.e., are the polymerization product of, at least one of trimethylene carbonate (TMC) and ε-caprolactone (CAP); and block B comprises residues formed from, i.e., are the polymerization product of, at least one of glycolide, lactide and p-dioxanone. Optionally, the multi-arm photopolymerizable compound has the structure CC-[A-B-Q]$_2$. Optionally, the multi-arm photopolymerizable compound has the structure CC-[A-B-Q]$_3$. Optionally, the multi-arm photopolymerizable compound has the structure CC-[A-B-Q]$_4$. Optionally, the multi-arm photopolymerizable compound has the structure CC-[B-A-Q]$_2$. Optionally, the multi-arm photopolymerizable compound has the structure CC-[B-A-Q]$_3$. Optionally, the multi-arm photopolymerizable compound has the structure CC-[B-A-Q]$_4$.

Disclosed herein are photopolymerizable compositions comprising photopolymerizable macromer components comprising macromers (with reactive end groups) comprising monomeric units of at least one lactone monomer, including but not limited to, glycolide, lactide, ε-caprolactone, trimethylene carbonate, p-dioxanone, 1,5-dioxepan-2-one, or a morpholine-2,5-dione. Photopolymerizable macromers may be for example, polyesters. In an aspect, a polyester comprises a segmented/block or a random copolymer having sequences derived from at least one monomer of glycolide-, lactide, trimethylene carbonate, p-dioxanone, or caprolactone. Photopolymerizable macromers may comprise polysaccharides or macromers comprising one or more of the following monosaccharide units: arabinose, fructose, galactose, galactopyranosyl, galacturonic acid, guluronic acid, glucuronic acid, glucose, glucoside, N-acetylglucosamine, mannuronic acid, mannose, pyranosyl sulfate, rhamnose, or xylose. Polysaccharides containing the foregoing units include cyclodextrins, starch, hyaluronic acid, deacetylated hyaluronic acid, chitosan, trehalose, cellobiose, maltotriose, maltohexaose, chitohexaose, agarose, chitin 50, amylose, glucans, heparin, xylan, pectin, galactan, glycosaminoglycans, dextran, aminated dextran, cellulose, hydroxyalkylcelluloses, carboxyalkylcelluloses, fucoidan, chondroitin sulfate, sulfate polysaccharides, mucopolysaccharides, gelatin, zein, collagen, alginic acid, agar, carrageean, guar gum, gum arabic, gum ghatti, gum karaya, gum konjak, gum tamarind, gum tara, gum tragacanth, locust bean gum, pectins, and xanthan gum. Polysaccharides that are either anionic or cationic include the natural polysaccharides alginic acid, carrageenan, chitosan (partially deacetylated chitin), gum arabic, gum ghatti, gum karaya, gum tragacanth, pectins, and xanthan gum. Synthetic polymers containing a plurality of pendent photopolymerizable groups are also suitable. Suitable synthetic polymers include poly(vinyl alcohol), poly(ethylene glycol), poly(propylene oxide), and PEG-block-PPO, PEG-block-PPO-block-PEG and PPO-block-PEG-block-PPO, each with acrylate or methacrylate end groups.

Disclosed herein are photopolymerizable compositions comprising photopolymerizable macromer components comprising macromers, and optionally monomeric units (monomers), with ethylenically unsaturated groups. In general, any monomers not inconsistent with the objectives of the present disclosure may be used. In an aspect, a macromer or monomer comprises one or more species of (meth)acrylates, such as one or more monofunctional, difunctional, trifunctional, tetrafunctional (meth)acrylates, and/or pentafunctional (meth)acrylates. In an aspect, a macromer or monomer comprises methyl (meth)acrylate, ethyl (meth)acrylate, n-propyl (meth)acrylate, n-butyl (meth)acrylate, isobutyl (meth)acrylate, n-hexyl (meth)acrylate, 2-ethylhexyl (meth)acrylate, n-octyl (meth)acrylate, n-decyl (meth)acrylate, n-dodecyl (meth)acrylate, 2-hydroxyethyl (meth)

acrylate, 2- or 3-hydroxypropyl (meth)acrylate, 2-methoxyethyl (meth)acrylate, 2-ethoxyethyl (meth)acrylate, 2- or 3-ethoxypropyl (meth)acrylate, tetrahydrofurfuryl methacrylate, isobornyl (meth)acrylate, 2-(2-ethoxyethoxy) ethyl acrylate, cyclohexyl methacrylate, 2-phenoxyethyl acrylate, glycidyl acrylate, isodecyl acrylate, 2-phenoxyethyl (meth)acrylate, lauryl methacrylate, or a combination thereof. In an aspect, a monomer comprises one or more of allyl acrylate, allyl methacrylate, triethylene glycol di(meth)acrylate, tricyclodecane dimethanol diacrylate, and cyclohexane dimethanol diacrylate. In an aspect, a macromer or monomer comprises diacrylate and/or dimethacrylate esters of aliphatic, cycloaliphatic or aromatic diols, including 1,3- or 1,4-butanediol, neopentyl glycol, 1,6-hexanediol, diethylene glycol, triethylene glycol, tetraethylene glycol, tripropylene glycol, 1,4-dihydroxymethylcyclohexane, 2,2-bis(4-hydroxycyclohexyl)propane or bis(4-hydroxycyclohexyl)methane, hydroquinone, 4,4'-dihydroxybiphenyl, bisphenol A, bisphenol F, or bisphenol S. In an aspect, a macromer or monomer may comprise 1,1-trimethylolpropane tri(meth)acrylate, pentaerythritol monohydroxy tri(meth)acrylate, dipentaerythritol monohydroxy penta(meth)acrylate, and/or bis(trimethylolpropane) tetra(meth)acrylate. In an aspect, a monomer may comprise an ethoxylated or propoxylated species, such as ethoxylated or propoxylated neopentyl glycol, ethoxylated or propoxylated bisphenol A, ethoxylated or propoxylated bisphenol F, ethoxylated or propoxylated bisphenol S, ethoxylated or propoxylated 1,1,1-trimethylolpropanetri(meth)acrylate, or ethoxylated or propoxylated glycerol tri(meth)acrylate.

In an aspect, a macromer or monomer may comprise isobornyl acrylate (IBOA), commercially available from SARTOMER (Sartomer Americas, 502 Thomas Jones Way, Exton, PA 19341) under the trade name SR 506; isobornyl methacrylate, commercially available from SARTOMER under the trade name SR 423A; triethylene glycol diacrylate, commercially available from SARTOMER under the trade name SR 272; triethylene glycol dimethacrylate, commercially available from SARTOMER under the trade name SR 205; tricyclodecane dimethanol diacrylate, commercially available from SARTOMER under the trade name SR 833S; tris(2-hydroxy ethyl)isocyanurate triacrylate, commercially available from SARTOMER under the trade name SR 368; 2-phenoxyethyl acrylate, commercially available from SARTOMER under the trade name SR 339; ethyoxylated (3 mole) bisphenol A diacrylate, commercially available from SARTOMER under the trade name SR 349; and dipentaerythritol pentaacrylate, commercially available from SARTOMER under the trade name SR 399 LV.

In an aspect, a macromer may comprise homopolymer or copolymers of at least the following classes: a polyester (meth)acrylate oligomer, polycarbonate (meth)acrylate oligomer, a urethane (meth)acrylate oligomer, thiol functionalized oligomers or an epoxy(meth)acrylate oligomer or combinations thereof. Classes of polymers or copolymers are well known in the art. In an aspect, a macromer may comprise an aliphatic polyester urethane acrylate oligomer, and/or an acrylate amine oligomeric resin, such as EBECRYL 7100 (Allnex, Frankfurt-Global HQ, The Squaire 13, Am Flughafen, 60549 Frankfurt am Main, Germany). In an aspect, a macromer may comprise a polypropylene glycol mono(meth)acrylate or polyethylene glycol mono(meth)acrylate. In an aspect, a macromer may comprise a monofunctional aliphatic urethane (meth)acrylate. In an aspect, a macromer may comprise a diacrylate and/or dimethacrylate ester of an aliphatic, cycloaliphatic or aromatic diol, including polyethylene glycol, etho inxylated or propoxylated neopentyl glycol, ethoxylated or propoxylated bisphenol A, ethoxylated or propoxylated bisphenol F, ethoxylated or propoxylated bisphenol S, ethoxylated or propoxylated 1,1,1-trimethylolpropanetri(meth)acrylate, or ethoxylated or propoxylated glycerol tri(meth)acrylate. In an aspect, a macromer may comprise alkoxylated tetrahydrofurfuryl acrylate, commercially available from SARTOMER under the trade name SR 611; monofunctional urethane acrylate, commercially available from RAHN USA Kinetik Technologies, 8 Crown Plaza, Suite 110, Hazlet, NJ 07730 USA) (under the trade name GENOMER 1122; and aliphatic urethane diacrylate, commercially available from ALLNEX under the trade name EBECRYL 8402. Other commercially available oligomeric curable materials may also be used. In an aspect, a macromer may comprise urethane (meth)acrylates. In an aspect, a macromer may comprise a polyester carbonate (meth)acrylate oligomer.

Photopolymerizable compositions disclosed herein comprise photoreactive compounds or compounds with light reactive groups (e.g., light reactive endgroups) that polymerize in light wavelengths from 10 nm to 770 nm. (UV 10-400) (visible 390-770), which is referred to herein as UV/Vis light.

Light Reflective Material

Photopolymerizable compositions disclosed herein comprise a light reflective material component comprising at least one light reflective material. The presence of a light reflective material in a photopolymerizable composition leads to the photopolymerizable composition photopolymerizing in a time that is faster than a photopolymerizable composition without the reflective material under the same polymerization conditions. In an aspect, the presence of a light reflective material in a photopolymerizable composition photopolymerizes at a faster rate, at the same light exposure (mJ/cm2) than a photopolymerizable composition without the reflective material under the same polymerization conditions. In an aspect, a light reflective material reflects light at the same wavelength that a photoinitiator absorbs light.

A light reflective material comprises organic compounds, inorganic compounds, or combinations thereof. In an aspect, a light reflective material may comprise an inorganic solid including, but not limited to, titanium dioxide, zinc oxide, barium sulfate, tricalcium phosphate, dicalcium phosphate, monocalcium phosphate, dicalcium diphosphate, calcium triphosphate, hydroxyapatite, apatite, and tetracalcium phosphate. In an aspect, a light reflective material may comprise organic compounds comprising aliphatic polymers and copolymers including but not limited to polyesters, polyurethanes, polyethers, polyanhydrides, polyamides, polysulfides, polycarbonates, polyketones, polyethylene, polypropylene, polyvinyl alcohol, polytetrafluoroethylene, polyvinyl chloride, polyimides, and polyhydroxy alkanoates or combinations thereof. For example, polyglycolide-co-lactide, polycaprolactone urethane, polyethylene glycol, and polyglycolide may be used as a light reflective material. In an aspect, a light reflective material may comprise organic compounds comprising aromatic polymers and copolymers including but not limited to polyesters, polyurethanes, polyarylates, polysulfides, polyethers, polyanhydrides, polyketones, polyamides, polycarbonates, and polyimides or combinations thereof. For example, poly ether ether ketone (PEEK) and poly-4-hydroxybenzoate may be used as a light reflective material. In an aspect, a light reflective material may comprise organic compounds comprising naturally derived polymers and derivatives including but not limited to cyclodextrins, starch, hyaluronic acid, deacetylated hyaluronic acid, chitosan, trehalose, cellobiose, maltotriose, maltohexaose, chitohexaose, agarose, chitin 50, amylose, glucans, heparin, xylan, pectin, galactan, glycosaminoglycans, dextran, aminated dextran, cellulose, hydroxyalkylcelluloses, carboxyalkylcelluloses, fucoidan, chondroitin sulfate, sulfate polysaccharides, mucopolysaccharides, gelatin, zein, collagen, alginic acid, agar, carrageean, guar gum, gum arabic, gum ghatti, gum karaya, gum konjak, gum tamarind, gum tara, gum tragacanth, locust bean gum, pectins, and xanthan gum. In an aspect, a light reflective material may comprise crystalline organic compounds comprising crystalline aliphatic and aromatic polymers. In an aspect, a light reflective material may comprise crystalline organic compounds comprising crystalline naturally derived polymers and derivatives. In an aspect, a light reflective material may comprise crystalline amino acids and their derivatives. In an aspect, a light reflective material may comprise crystalline fatty acids and their derivatives, including but not limited to palmitic acid, ascorbyl palmitate, lauric acid, glycerol monolaurate, myristic aid, and capric acid. In an aspect, a light reflective material may comprise crystalline peptides. As used herein, the term crystalline includes semi-crystalline material. As those of skill in the art recognize, a crystalline material is one in which its constituents (chains, in case of polymers) are highly ordered to form an organized structure or alignment. In the case of semi-crystalline polymers, there are ordered and unordered regions. A light reflective material component of a photopolymerizable composition disclosed herein may comprise from about 5 wt % to about 90 wt % of the photopolymerizable composition, or from about 5 wt % to about 85 wt %, or from about 5 wt % to about 80 wt %, or from about 5 wt % to about 75 wt %, or from about 5 wt % to about 70 wt %, or from about 5 wt % to about 65 wt %, or from about 5 wt % to about 60 wt %, or from about 5 wt % to about 55 wt %, or from about 5 wt % to about 50 wt %, or from about 15 wt % to about 45 wt %, or from about 5 wt % to about 45 wt % of the photopolymerizable composition, or from about 10 wt % to about 35 wt % of the photopolymerizable composition, and all ranges therein between. In an aspect, a light reflective material component comprises a particulate light reflective material in a size from sub 1 micron to 500 microns and all ranges therein between. For example, a particulate light reflective material may be sized less than 30 microns, sized less than 5 microns, or sized equal to or less than 1 micron, and including nanoparticles. In an aspect, a light reflective material component comprises a particulate light reflective material that is shaped as a sphere, cube, cone, cuboid, cylinder, pyramid, prism, polyhedron, or irregular shape, or mixtures thereof. In an aspect, a light reflective material component comprises a particulate light reflective material that has a smooth surface. In an aspect, a light reflective material component comprises a particulate light reflective material that has a rough or irregular surface. In an aspect, a light reflective material component comprises light reflective material that is a liquid.

In an aspect, a light reflective material component comprises light reflective material that is absorbable or biodegradable in physiological conditions. In an aspect, a light reflective material component comprises light reflective material that is biocompatible for biological organisms. In an aspect, a light reflective material component comprises light reflective material that is not absorbable or biodegradable in physiological conditions. In an aspect, a light reflective material may polymerize with at least one of a photopolymerizable macromer, a diluent, a light reflective material, or a combination thereof. In an aspect, a light reflective material component consists essentially of a light reflective material.

Photoinitiator

Photopolymerizable compositions disclosed herein comprise a photoinitiator component comprising at least one photoinitiator. In an aspect, a photoinitiator component comprises a concentration range of from about 0.01 wt % to about 5.0 wt % of the photopolymerizable composition, from about 0.05 wt % to about 4.5 wt %, from about 0.05 wt % to about 4.0 wt %, from about 0.1 wt % to about 5.0 wt %, from about 0.05 wt % to about 3.0 wt %, from about 0.1 wt % to about 3.0 wt %, from about 0.05 wt % to about 2.0 wt %, from about 0.05 wt % to about 1.0 wt %, from about 0.1 wt % to about 1.0 wt %, from about 0.07 wt % to about 1.0 wt %, from about 0.2 wt % to about 1.0 wt %, from about 0.5 wt % to about 1.0 wt %, from about 1.0 wt % to about 2.0 wt %, from about 0.1 wt % to about 2.0 wt %, from about 0.05 wt % to about 5.0 wt %, from about 0.05 wt % to about 0.1 wt %, from about 0.01 wt % to about 0.099 wt %, from about 0.01 wt % to about 0.09 wt %, from about 0.01 wt % to about 0.085 wt %, from about 0.01 wt % to about 0.080 wt %, from about 0.01 wt % to about 0.070 wt %, from about 0.01 wt % to about 0.060 wt %, from about 0.01 wt % to about 0.050 wt %, from about 0.01 wt % to about 0.040 wt %, from about 0.01 wt % to about 0.030 wt %, from about 0.01 wt % to about 0.020 wt %, from about 0.01 wt % to about 0.015 wt %, and all ranges therein between. In an aspect, a photoinitiator component comprises less than 1.0 wt % of the photopolymerizable composition. In an aspect, a photoinitiator component is less than 0.50 wt % of the photopolymerizable composition. In an aspect, a photoinitiator component is 0.25 wt % of the photopolymerizable composition. In an aspect, a photoinitiator component is less than 0.25 wt % of the photopolymerizable composition. In an aspect, a photoinitiator component is 0.10 wt % of the photopolymerizable composition. In an aspect, a photoinitiator component is less than 0.10 wt % of the photopolymerizable composition.

Photopolymerizable compositions disclosed herein comprise at least one photoinitiator that absorbs a wavelength of light in a range between about 200 nm to about 770 nm, and all wavelengths therein between. In an aspect, a photoinitiator component comprises a photoinitiator that absorbs a wavelength of light of greater than or equal to 300 nm. In an aspect, a photoinitiator component comprises a photoinitiator that absorbs a wavelength of light of greater than or equal to 365 nm. In an aspect, a photoinitiator component comprises a photoinitiator that absorbs a wavelength of light of greater than or equal to 375 nm. In an aspect, a photoinitiator component comprises a photoinitiator that absorbs a wavelength of light of greater than or equal to 400 nm.

Photopolymerizable compositions disclosed herein comprise at least one photoinitiator in a photoinitiator component. In an aspect, a photoinitiator component comprises a Type I photoinitiator, a Type II photoinitiator, or a combination of a Type I and a Type II photoinitiator. In an aspect, a photoinitiator component comprises a cationic photoinitiator.

Free radical generating photoinitiators are used to cure through double bonds, most commonly acrylate and methacrylate monomers or oligomers. There are two types of free-radical generating photoinitiators, designated as Type I and Type II photoinitiators.

Type I photoinitiators are unimolecular free-radical generators; that is upon the absorption of UV-visible light a specific bond within the initiator's structure undergoes homolytic cleavage to produce free radicals. Homolytic cleavage is a bonding pair of electron's even scission into to free radical products. Examples of homolytic cleavage is seen in several common classes of Type I photoinitiators: benzoin ethers, benzyl ketals, α-dialkoxy-aceto-phenones, α-hydroxy-alkyl-phenones, and acyl phosphine oxides. Type II photoinitiators generally require a co-initiator, usually an alcohol or amine, functional groups that can readily have hydrogens abstracted, in addition to the photoinitiator. The absorption of UV-visible light by a Type-II photoinitiator causes an excited electron state in the photoinitiator that will abstract a hydrogen from the co-initiator, and in the process, splitting a bonding pair of electrons. Benzophenone, thio-xanthones, and benzophenone-type photoinitiators are common Type II photoinitiators. Further examples of some common Type II photoinitiators include but are not limited to riboflavin, Eosin Y, and camphorquinone. Once the free-radicals are generated, the polymerization mechanism is similar to any free-radical polymerization process. Other commercially available Type I photoinitiators, available from for example BASF, BASF SE, Ludwigshafen, Germany, include, but are not limited to, Irgacure 369, Irgacure 379, Irgacure 907, Darocur 1173, Irgacure 184, Irgacure 2959, Darocur 4265, Irgacure 2022, Irgacure 500, Irgacure 819, Irgacure 819-DW, Irgacure 2100, Lucirin TPO, Lucirin TPO-L, Irgacure 651, Darocur BP, Irgacure 250, Irgacure 270, Irgacure 290, Irgacure 784, Darocur MBF, Irgacure 754, lithium phenyl-2,4,6-trimethylbenzoylphosphinates, magnesium phenyl-2,4,6-trimethylbenzoylphosphinates, and sodium phenyl-2,4,6-trimethylbenzoylphosphinates.

In an aspect, a stereolithography ink composition disclosed herein comprises at least one photopolymerizable macromer component; at least one light reflective material component comprising a light reflective material suspended in the photopolymerizable composition; at least one photoinitiator component in a total concentration of less than 0.1 wt % or less than 1.0 wt %, wherein the light reflective material component modulates the light dose of the composition when compared to the light dose of the composition without the light reflective material; a reactive diluent; and a stabilizer. In an aspect, the light reflective material component provides an increased polymerization rate at the surface of a photopolymerizable composition where the light contacts the composition in comparison to the same photopolymerizable composition without the light reflective material component. In an aspect, incorporation of a light reflective material component into a photopolymerizable composition provides a surface cure of the photopolymerizable macromers at a lower concentration of photoinitiator than the concentration used in the photopolymerizable composition without the light reflective material component.

Photopolymerizable compositions disclosed herein are made by combining disclosed components, for example, photopolymerizable macromers, UV reflective material and photoinitiator, and optionally, other components such as stabilizers or diluents. Disclosed components are mixed until an homogenous composition is formed. Optionally, disclosed components may comprise a dispersion agent to aid in suspension. Disclosed components may be mixed using a homogenizer. Disclosed components may optionally be heated prior to mixing. Disclosed components may optionally be placed under vacuum to remove gas bubbles.

Disclosed compositions herein comprise a non-toxic, biocompatible polymeric composition, comprising photopolymerized macromers and a non-toxic amount of at least one photoinitiator. In an aspect, a non-toxic, biocompatible polymeric composition may comprise photopolymerized diluent. In an aspect, a non-toxic, biocompatible polymeric composition may comprise photopolymerized light reflective material. In an aspect, a non-toxic, biocompatible polymeric composition may comprise a medical device component. In an aspect, a non-toxic, biocompatible polymeric composition may comprise photopolymerized macromers and a non-toxic amount of at least one photoinitiator as a coating on at least a portion of an article, and optionally, other components disclosed herein, e.g., a light reflective material Methods disclosed herein comprise methods for making and using photopolymerizable compositions, for example, to make additively manufactured articles. For example, a composition disclosed herein may be used as photopolymerizable or photocurable ink or resin in additive manufacturing or 3-D printing methods. In an aspect, a composition disclosed herein may be used as photopolymerizable or photocurable ink or resin in any known or later-developed 3-D printing method. For example, a composition disclosed herein may be used as photopolymerizable or photocurable ink or resin in 3-D printing method of stereolithography (SLA). A disclosed method for photopolymerizable 3-D printing (additive manufacture of) an article comprises exposing for a time with light, a photopolymerizable composition comprising at least one photopolymerizable macromer component; at least one light reflective material component comprising a light reflective material suspended in the photopolymerizable composition; and at least one photoinitiator component; wherein the light reflective material component modulates the light dose of the photopolymerizable composition when compared to the light dose of the photopolymerizable composition without the light reflective material; and forming a printed article comprising at least the polymerized macromers. In an aspect, the light reflective material component provides an increased polymerization rate at the surface of a photopolymerizable composition where the light contacts the photopolymerizable composition in comparison to the same photopolymerizable composition without the light reflective material component. In an aspect, incorporation of a light reflective material component into a photopolymerizable composition provides a surface cure of the macromer at a lower concentration of photoinitiator than the concentration used in the photopolymerizable composition without the light reflective material component. Any of the compositions disclosed herein may be used in a method for photopolymerizable 3-D printing of an article. For example, a photopolymerizable composition may comprise a reactive diluent or a nonreactive diluent. A reactive diluent is a diluent that participates in the polymerization reaction, for example, the reactive diluent is polymerized with, for example, a macromer. A photopolymerizable composition may comprise a stabilizer, for example, a free radical stabilizer. Compositions disclosed herein may comprise a particulate light reflective material. In an aspect, a light reflective material may reflect UV light, visible light or both. In an aspect, a photopolymerizable composition may be heated or cooled, and a method for SLA printing of an article may comprise one or more steps of heating or cooling a photopolymerizable composition.

In an aspect, a photopolymerizable composition may comprise an active agent. The active agent may be one of any of the components of a photopolymerizable composition or any of the components of a photopolymerizable composition may comprise an active agent. For example, a light reflective material, a macromer, a diluent or a stabilizer may comprise or may be an active agent.

A method for printing an article by photopolymerizable 3-D printing may further comprise a secondary curing step comprising curing the printed article. A method may comprise pre- and post-treatments of a printed article. For example, the printed article may be rinsed after printing, before a secondary curing step, after a secondary printing step or before or after each of these steps. A secondary curing step involves exposing at least a portion of the printed article so that at least a portion of the printed article undergoes a second polymerization reaction. For example, a portion of an article may be exposed to the same or different wavelength radiation as was used in the first polymerization step, and photoinitiators, which may be the same or different photoinitiators as those reacting in the first polymerization step, may be activated to cause previously unpolymerized or partially polymerized reactive groups to undergo polymerization reactions and to polymerize. A secondary curing step may change properties of the printed article. For example, the printed article, after the initial printing step, is soft and pliable throughout. After exposing the exterior of the printed article to a secondary curing step, for example, using a different wavelength radiation, the exterior of the printed article is hard and not pliable.

A printed article is the article resulting after a photopolymerizable 3-D printing period is completed. The printed article may be a structure or a portion of a structure. The printed article may be a coating that is printed onto a surface. Printing is used to mean contacting a polymeric composition with a surface and causing the polymeric composition to polymerize. Printing may involve contacting a polymeric composition with a surface that is then exposed to UV/Vis light so that the polymeric composition undergoes polymerization. The surface that the polymeric composition contacts may be any surface including a polymerized layer of the polymeric composition.

A printed article may or may not contain residual amounts of components of a photopolymerizable composition. For example, a printed article may comprise diluent or photopolymerized diluent, or photoinitiator. In an aspect, a printed article or a photopolymerizable composition may have additives. Additives may include thixotropic materials, colorants, tracer materials or conductive materials. For example, an additive may be a dye. A printed article may be colored due to the presence of a dye, or may have any desired attribute such as having at least a portion of the article that is, but is not limited to, fluorescent, radioactive, reflective, flexible, stiff, pliable, breakable, or a combination thereof.

A method of photopolymerizably 3-D printing an article may comprise photopolymerizing a photopolymerizable composition comprising monomers or macromers that are capable of undergoing polymerization, such as monomers or macromers that have functional groups capable of undergoing photopolymerizable reactions to form oligomers and/or polymers. In an aspect, aliphatic or aromatic macromers and monomers may comprise ethylenically unsaturated reactive groups or end groups. Disclosed macromers and monomers are functional in the disclosed methods herein.

Methods for photopolymerizably 3-D printing, such as DLP, SLA, injection based printing, injet, or CLIP, an article comprise photopolymerizing photopolymerizable compositions at light wavelength from about 10 nm to about 770 nm. (UV 10-400) (visible 390-770). In an aspect, photopolymerizable compositions comprising a light reflective material component photopolymerizes in a shorter exposure time than a photopolymerizable composition without the light reflective material component under the same polymerization conditions.

A method of printing an article using photopolymerization technology in a device for printing by 3D photopolymerization comprises photopolymerizing a photopolymerizable compositions comprising a photoinitiator component. A photoinitiator component may comprise one or more photoinitiators, and may also comprise other materials, for example, a diluent, excipient, inhibitors, or other solutions. In an aspect, a photoinitiator component comprises a concentration range of from about 0.05 wt % to about 5.0 wt % of the photopolymerizable composition, from about 0.05 wt % to about 4.5 wt %, from about 0.05 wt % to about 4.0 wt %, from about 0.1 wt % to about 5.0 wt %, from about 0.05 wt % to about 3.0 wt %, from about 0.1 wt % to about 3.0 wt %, from about 0.05 wt % to about 2.0 wt %, from about 0.05 wt % to about 1.0 wt %, from about 0.1 wt % to about 1.0 wt %, from about 0.07 wt % to about 1.0 wt %, from about 0.2 wt % to about 1.0 wt %, from about 0.5 wt % to about 1.0 wt %, from about 1.0 wt % to about 2.0 wt %, from about 0.1 wt % to about 2.0 wt %, from about 0.05 wt % to about 5.0 wt %, from about 0.05 wt % to about 0.1 wt % and all ranges therein between. In an aspect, a photoinitiator component may be in a concentration of less than 0.50 wt % of the photopolymerizable composition. In an aspect, a photoinitiator component may be 0.25 wt % of the photopolymerizable composition. In an aspect, a photoinitiator component may be less than 0.25 wt % of the photopolymerizable composition. In an aspect, a photoinitiator component may be 0.10 wt % of the photopolymerizable composition. In an aspect, a photoinitiator component may be less than 0.10 wt % of the photopolymerizable composition.

A method of printing an article using photopolymerization technology in a device for printing by 3D photopolymerization comprises photopolymerizing a photopolymerizable compositions comprising at least one photoinitiator that absorbs at a wavelength of light from about 10 nm to about 770 nm. In an aspect, a photoinitiator absorbs at a wavelength of light of greater than or equal to 300 nm. In an aspect, a photoinitiator absorb at a wavelength of light of than or equal to 365 nm. In an aspect, a photoinitiator absorb at a wavelength of light of greater than or equal to 375 nm. In an aspect, a photoinitiator absorb at a wavelength of light of greater than or equal to 400 nm. A method of printing an article using SLA in a device for printing by SLA comprises photopolymerizable compositions comprising at least one photoinitiator component that comprises a photoinitiator that is a Type I, Type II, a cationic photoinitiator or a combination thereof. A method of printing an article using photopolymerization technology in a device for printing by 3D photopolymerization comprises photopolymerizing a photopolymerizable composition comprising at least one photoinitiator that absorbs at a wavelength of light that is reflected by at least one light reflective component of the photopolymerizable composition.

The present disclosure contemplates using disclosed formulations in a photopolymerization printing device or method, and is not limited to any particular manufacturing or production method. Disclosed manufacturing or production methods include, but are not limited to, DLP (Digital light processing), SLA (stereolithography), injection based printing, inkjet, and CLIP (continuous liquid interface production). A method of printing an article using SLA in a device for printing by SLA comprises photopolymerizing or curing a photopolymerizable composition at a depth of less than 150 microns. In an aspect, a method disclosed herein comprises photopolymerizing or curing a photopolymerizable composition at a depth of from about 1 micron to about 50 microns, and all depths therein between. A method of printing an article from a photopolymerizable macromer, UV reflective material, and photoinitiator using continuous liquid interphase printing (see for example, U.S. Pat. No. 9,205,601B2). CLIP is a method of 3D printing that uses photopolymerization to create solid objects of a wide variety of shapes using photopolymerizable resins. The continuous process begins with a pool of liquid photopolymer resin. Part of the pool bottom is transparent to ultraviolet light (the "window"). An ultraviolet light beam shines through the window, illuminating the precise cross-section of the object. The light causes the resin to solidify. The object rises slowly enough to allow resin to flow under and maintain contact with the bottom of the object. An oxygen-permeable membrane lies below the resin, which creates a "dead zone" (persistent liquid interface) preventing the resin from attaching to the window (photopolymerization is inhibited between the window and the polymerizer).

A method of printing an article using photopolymerization in a device for printing by photopolymerizable 3-D additive manufacturing comprises photopolymerizing a photopolymerizable compositions comprising at least one light reflective material component comprising light reflective materials including, but not limited to, inorganic or organic compounds. In an aspect, a light reflective material may comprise an inorganic solid including but not limited to titanium dioxide, zinc oxide, barium sulfate, tricalcium phosphate, dicalcium phosphate, monocalcium phosphate, dicalcium diphosphate, calcium triphosphate, hydroxyapatite, apatite, and tetracalcium phosphate. In an aspect, the light reflective material may comprise organic compounds comprising aliphatic polymers and copolymers including but not limited to polyesters, polyurethanes, polyethers, polyanhydrides, polyamides, polycarbonates, polyketones, polyethylene, polypropylene, polyvinyl alcohol, polytetrafluoroethylene, polyvinyl chloride, polyimides, and polyhydroxy alkanoates or combinations thereof. In an aspect, the light reflective material may comprise organic compounds comprising aromatic polymers and copolymers including but not limited to polyesters, polyurethanes, polyethers, polyanhydrides, polyketones, polyamides, polycarbonates, and polyimides or combinations. In an aspect, the light reflective material may comprise organic compounds comprising naturally derived polymers and derivatives including but not limited to cyclodextrins, starch, hyaluronic acid, deacetylated hyaluronic acid, chitosan, trehalose, cellobiose, maltotriose, maltohexaose, chitohexaose, agarose, chitin 50, amylose, glucans, heparin, xylan, pectin, galactan, glycosaminoglycans, dextran, aminated dextran, cellulose, hydroxyalkylcelluloses, carboxyalkylcelluloses, fucoidan, chondroitin sulfate, sulfate polysaccharides, mucopolysaccharides, gelatin, zein, collagen, alginic acid, agar, carrageean, guar gum, gum arabic, gum ghatti, gum karaya, gum konjak, gum tamarind, gum tara, gum tragacanth, locust bean gum, pectins, and xanthan gum. In an aspect, the light reflective material may comprise crystalline organic compounds comprising crystalline aliphatic and aromatic polymers. In an aspect, the light reflective material may comprise crystalline organic compounds comprising crystalline naturally derived polymers and derivatives. In an aspect, a light reflective material may comprise crystalline amino acids and their derivatives. In an aspect, a light reflective material may comprise crystalline fatty acids and their derivatives, including but not limited to palmitic acid, ascorbyl palmitate, lauric acid, glycerol monolaurate, myristic aid, and capric acid. In an aspect, a light reflective material may comprise crystalline peptides.

In an aspect, a light reflective material component comprises from about 5 wt % to about 90 wt % of the photopolymerizable composition, or from about 5 wt % to about 85 wt %, or from about 5 wt % to about 80 wt %, or from about 5 wt % to about 75 wt %, or from about 5 wt % to about 70 wt %, or from about 5 wt % to about 65 wt %, or from about 5 wt % to about 60 wt %, or from about 5 wt % to about 55 wt %, or from about 5 wt % to about 50 wt %, or from about 15 wt % to about 45 wt %, or from about 5 wt % to about 45 wt % of the photopolymerizable composition, or from about 10 wt % to about 35 wt % of the photopolymerizable composition, and all ranges therein between. In an aspect, a light reflective material component comprises from about 5 wt % to about 45 wt % of the photopolymerizable composition. In an aspect, a light reflective material component comprises from about 10 wt % to about 35 wt % of the photopolymerizable composition. In an aspect, a light reflective material component a particulate light reflective material sized less than 500 microns. In an aspect, a light reflective material component comprises a particulate light reflective material sized less than 30 microns. In an aspect, a light reflective material component comprises a particulate light reflective material sized less than 5 microns. In an aspect, a light reflective material component comprises a particulate light reflective material sized less than 1 micron. In an aspect, a light reflective material component comprises a particulate light reflective material that is shaped as a sphere, cube, cone, cuboid, cylinder, pyramid, prism, poly-hedron, or irregular shape, or mixtures thereof. In an aspect, a light reflective material component comprises a particulate light reflective material and has a smooth surface. In an aspect, a light reflective material component comprises a particulate light reflective material and has a rough or irregular surface. In an aspect, a light reflective material component comprises a liquid.

A method of printing an article using photopolymerization in a device for printing by photopolymerizable 3-D additive manufacturing, such as DLP, SLA, injection based printing, injet, or CLIP, comprises photopolymerizing a photopolymerizable compositions comprising a light reflective material component comprising a light reflective material that is absorbable in physiological conditions. In an aspect, a light reflective material component comprises a light reflective material that is biocompatible for biological organisms. In an aspect, a light reflective material component comprises a light reflective material that polymerizes with at least one of a photopolymerizable macromer, a diluent, a light reflective material, or a combination thereof.

The present disclosure comprises a polymer polymerized by the methods disclosed herein from compositions disclosed herein. In an aspect, the polymer comprises macromers and/or monomers known to those of skill in the art, macromers and/or monomers disclosed herein, or both macromers and/or monomers disclosed herein and known in the art.

The present disclosure comprises an article, which may be referred to herein as a printed article, made by methods disclosed herein from compositions disclosed herein. In an aspect, an article may be a medical device. In an aspect, an article may be a portion of a medical device. In an aspect, an article may be a coating that is applied to, e.g., photoprinted on, all or a portion of a solid object, such as a medical device. In an aspect, an article may be porous. In an aspect, an article may be biodegradable under physiological conditions. In an aspect, a biodegradable article may have a degradation rate of from about three days to about five years. In an aspect, an article may not be biodegradable. In an aspect, a portion of an article may be biodegradable and a second portion may be nonbiodegradable or have a different degradation time from the degradation time of the first portion or the rest of the article. The article may be drug-eluting, for example, all or a portion of an article may elute an active agent that was comprised in the photopolymerizable composition.

The present disclosure comprises a kit comprising a photopolymerizable composition or a portion of a photopolymerizable composition disclosed herein, for example, a light reflective material component, contained within a container, and optionally, further comprising written instructions for its use. A kit may comprise a printed article disclosed herein, contained within a container, and optionally, further comprising written instructions for its use. A kit may comprise of one or more of each the following parts: a photopolymerizable composition, light reflective material, and photoinitiator. In an aspect, a kit may comprise one or more of the following parts: photopolymerizable composition with photoinitiator and light reflective material. In an aspect, a kit may comprise of one or more of the following parts: photopolymerizable composition with photoinitiator, a photopolymerizable composition, and light reflective material. A kit may comprise a printed sterilized part disclosed herein, contained within a container, and optionally, further comprising written instructions for its use.

Definitions

As used herein, nomenclature for compounds, including organic compounds, can be given using common names, IUPAC, IUBMB, or CAS recommendations for nomenclature. When one or more stereochemical features are present, Cahn-Ingold-Prelog rules for stereochemistry can be employed to designate stereochemical priority, E/Z specification, and the like. One of skill in the art can readily ascertain the structure of a compound if given a name, either by systemic reduction of the compound structure using naming conventions, or by commercially available software, such as CHEMDRAW™ (Cambridgesoft Corporation, U.S.A.).

As used in the specification and the appended claims, the singular forms "a," "an" and "the" include plural referents unless the context clearly dictates otherwise. Thus, for example, reference to "a functional group," "an alkyl," or "a residue" includes mixtures of two or more such functional groups, alkyls, or residues, and the like.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

As used herein, when a compound is referred to as a monomer or a compound, it is understood that this is not interpreted as one molecule or one compound. For example, two monomers generally refer to two different monomers, and not two molecules.

As used herein, modulates, modulate, and modulating means a change in a measured characteristic. The change may be an increase or decrease in the characteristic. A modulating factor or component may cause the change. The effect after adding a modulating factor is the change, and is compared to an original state that existed before the modulating factor was added or to an identical composition or situation that existed without the modulating factor.

As used herein, the terms "optional" or "optionally" means that the subsequently described event or circumstance can or cannot occur, and that the description includes instances where said event or circumstance occurs and instances where it does not.

As used herein, the terms "about," "approximate," and "at or about" mean that the amount or value in question can be the exact value designated or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, "cure" means a change in the physical, chemical, or physical and chemical properties of the material, and as is generally understood for polymeric materials, "cure" means the composition transforms from a liquid to a solid or semi-solid.

As used herein, the term "subject" can be a vertebrate, such as a mammal, a fish, a bird, a reptile, or an amphibian. Thus, the subject of the herein disclosed methods can be a human, non-human primate, horse, pig, rabbit, dog, sheep, goat, cow, cat, guinea pig or rodent. The term does not denote a particular age or sex. Thus, adult and newborn subjects, as well as fetuses, whether male or female, are intended to be covered. In an aspect, a mammalian subject is a human. A patient refers to a subject afflicted with a disease or disorder. The term "patient" includes human and veterinary subjects.

As used herein, an "active agent" means a substance, for example, compounds or molecules, or protein-, carbohydrate- or nucleic acid-based substances, capable of producing an effect. Active agent includes, but is not limited to, a chemical agent, a therapeutic agent, a pharmaceutical agent, a diagnostic agent, a prophylactic agent, an imaging agent and other agents having specific physiological effects, e.g., growth factors, immunological agents, wound healing factors, etc. In some instances, an active agent may include an active force, for example, radiation.

As used herein, a "reactive diluent" means a liquid formulation that is capable of polymerizing with one or more components or molecules in a mixture.

As used herein, a "macromer" is an assembly of pre-polymerized monomers, that may or may not have been modified, that acts as a photopolymerizable unit in polymerization reactions.

As used herein, the terms "administering" and "administration" refer to any method of providing a disclosed composition to a subject.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting of" may exclude any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" may limit the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives, at a level that is appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure. Many embodiments herein are described using open "comprising" language. Such embodiments encompass multiple closed "consisting of" and/or "consisting essentially of" embodiments, which may alternatively be claimed or described using such language.

As used herein, the term "polymer" refers to a chain of repeating structural units or "monomers". Examples of polymers include homopolymers (single type of monomer sub-units), copolymers or heteropolymers (two or more types of monomer subunits). As used herein, the term "linear polymer" refers to a polymer in which the molecules form long chains without branches or crosslinked structures. As used herein, the term "branched polymer" refers to a polymer comprising a polymer backbone with one or more additional monomers, or chains or monomers, extending from the polymer backbone.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose. Unless stated otherwise, all percentages, parts, ratios, and like amounts, are defined by weight.

All patents, patent applications and references included herein are specifically incorporated by reference in their entireties.

It should be understood, of course, that the foregoing relates only to preferred embodiments of the present disclosure and that numerous modifications or alterations may be made therein without departing from the spirit and the scope of the disclosure as set forth in this disclosure.

Disclosed herein are methods for photopolymerizing, e.g., printing an article. Steps may include a) exposing for a time with light, a photopolymerizable composition comprising, i) at least one photopolymerizable macromer component; ii) at least one light reflective material component comprising a light reflective material suspended in the photopolymerizable composition; and iii) at least one photoinitiator component; wherein the light reflective material component modulates the light dose of the composition when compared to the light dose of the composition without the light reflective material, and forming a printed article comprising at least the polymerized macromers. A light reflective material component may provide an increased polymerization rate at the surface of a photopolymerizable composition where the light contacts the composition in comparison to the same photopolymerizable composition without the light reflective material component. Incorporation of a light reflective material component into a photopolymerizable composition provides a surface cure of the macromer at a lower concentration of photoinitiator than the concentration used in the photopolymerizable composition without the light reflective material component. A photoinitiator component may be in a total concentration of less than 0.01 wt %. A photopolymerizable composition may further comprise a reactive diluent. A photopolymerizable composition may further comprise a nonreactive diluent. A photopolymerizable composition may further comprise a reactive or nonreactive viscosity modifier to increase the viscosity. A photopolymerizable composition may further comprise a stabilizer, which may be a free radical stabilizer.

A light reflective material component may further comprise a particulate light reflective material. A light reflective material component may comprise light reflective material that reflects UV light, visible light or both. A photopolymerizable composition may be heated before or during manufacturing steps. A photopolymerizable composition may be cooled before or during manufacturing step.

A photopolymerizable composition may further comprise an active agent. A light reflective material component may comprise an active agent. A light reflective material may be an active agent. A photopolymerizable macromer component may comprise an active agent. A photopolymerizable macromer may be an active agent. A reactive diluent may comprise an active agent. A reactive diluent may be an active agent. A nonreactive diluent may comprise an active agent. A nonreactive diluent may be an active agent. A photopolymerizable composition may further comprise a dye.

Methods for photopolymerizing, e.g., printing an article, may include steps comprising a secondary curing step comprising curing the printed article. A method may comprise rinsing the printed article. A method may comprise rinsing the secondarily cured printed article. A method may comprise steps resulting in the printed article comprising residual diluent or photopolymerized diluent. A method may comprise steps resulting in the printed article comprising residual photoinitiator.

A method disclosed herein may comprise steps comprising a photopolymerizable composition wherein the photopolymerizable macromer component comprises monomers with, or macromers with monomeric units (monomers), with ethylenically unsaturated groups. A method disclosed herein may comprise steps resulting in the printed article comprising a photopolymerizable composition wherein the photopolymerizable macromer component comprises monomers with, or macromers with monomeric units (monomers), with thiol groups. A method disclosed herein may comprise steps resulting in a printed article comprising a photopolymerizable composition wherein the photopolymerizable macromer component comprises monomers with, or macromers with monomeric units f (monomers), with thiol groups and monomers with, or macromers with monomeric units (monomers), with ethylenically unsaturated groups A photopolymerizable compositions and methods making and using such photopolymerizable compositions may comprise a photopolymerizable macromer component comprising macromers comprising monomeric units of at least one lactone monomer, glycolide, lactide, ε-caprolactone, trimethylene carbonate, p-dioxanone, 1,5-dioxepan-2-one, or a morpholine-2,5-dione, or combinations thereof.

A method disclosed herein may comprise steps wherein the light wavelength used for photopolymerization is from 10 nm to 700 nm. (UV 10-400) (visible 390-700). A method disclosed herein may comprise steps wherein the photopolymerizable composition photopolymerizes in a time that is faster than a photopolymerizable composition without the reflective material under the same polymerization conditions. A method disclosed herein may comprise steps wherein the photopolymerizable composition photopolymerizes in a time that is faster than a photopolymerizable composition without the reflective material under the same polymerization conditions. A method disclosed herein may comprise steps wherein the photopolymerizable composition photopolymerizes at a faster rate, at the same light exposure (mW/cm2) than a photopolymerizable composition without the reflective material under the same polymerization conditions. A method disclosed herein may comprise steps wherein the photopolymerizable composition photopolymerizes at a faster rate, at the same light exposure (mW/cm2) than a photopolymerizable composition without the reflective material under the same polymerization conditions.

A method disclosed herein may comprise steps comprising a photopolymerizable composition wherein the photoinitiator component is less than 5.00 wt % of the photopolymerizable composition, or wherein the photoinitiator component is less than 0.50 wt % of the photopolymerizable composition, or wherein the photoinitiator component is 0.25 wt % of the photopolymerizable composition, or wherein the photoinitiator component is less than 0.25 wt % of the photopolymerizable composition, or wherein the photoinitiator component is 0.10 wt % of the photopolymerizable composition, or wherein the photoinitiator component is less than 0.10 wt % of the photopolymerizable composition, or wherein the photoinitiator component is in a concentration range of from about 0.05 wt % to about 5.0 wt %.

A method disclosed herein may comprise steps comprising a photopolymerizable composition wherein the photoinitiator component comprises a photoinitiator that absorbs a wavelength of light of greater than or equal to 300 nm, or wherein the photoinitiator component comprises a photoinitiator that absorbs a wavelength of light of greater than or equal to 365 nm, or wherein the photoinitiator component comprises a photoinitiator that absorbs a wavelength of light of greater than or equal to 375 nm, wherein the photoinitiator component comprises a photoinitiator that absorbs a wavelength of light of greater than or equal to 400 nm, or wherein the photoinitiator component comprises at least one photoinitiator that absorbs a wavelength of light in a range between about 200 nm to about 770 nm. A method disclosed herein may comprise steps comprising a photopolymerizable composition wherein the photoinitiator component comprises a Type I photoinitiator, a Type II photoinitiator, or a combination of a Type I and a Type II photoinitiator, or wherein the photoinitiator component comprises a cationic photoinitiator, or wherein the photoinitiator absorbs at a wavelength that is reflected by the light reflective material.

A method disclosed herein may comprise steps wherein the curing depth is less than 150 microns, or wherein the curing depth is between about 1 micron to about 50 microns.

A method disclosed herein may comprise steps comprising a photopolymerizable composition wherein the light reflective material component comprises from about 5 wt % to about 90 wt % of the photopolymerizable composition, or wherein the light reflective material component comprises from about 5 wt % to about 45 wt % of the photopolymerizable composition, or wherein the light reflective material component is from about 10 wt % to about 35 wt % of the photopolymerizable composition. A method disclosed herein may comprise steps comprising a photopolymerizable composition wherein the light reflective material component comprises a particulate light reflective material sized less than 500 microns, or wherein the light reflective material component comprises a particulate light reflective material sized less than 30 microns, or wherein the light reflective material component comprises a particulate light reflective material sized less than 5 microns, or wherein the light reflective material component comprises a particulate light reflective material sized less than 1 micron. A method disclosed herein may comprise steps comprising a photopolymerizable composition wherein the light reflective material component comprises a particulate light reflective material that is shaped as a sphere, cube, cone, cuboid, cylinder, pyramid, prism, poly-hedron, or irregular shape, or mixtures thereof, or wherein the light reflective material component comprises a particulate light reflective material and has a smooth surface, or wherein the light reflective material component comprises a particulate light reflective material and has a rough or irregular surface.

A method disclosed herein may comprise steps comprising a photopolymerizable composition wherein the light reflective material component comprises light reflective material that comprises organic compounds, inorganic compounds, or combinations thereof, or wherein the light reflective material component comprises light reflective material that is a liquid, or wherein the light reflective material component comprises light reflective material that is absorbable in physiological conditions, or wherein the light reflective material component comprises light reflective material that is nondegradable or nonabsorbable in physiological conditions, or wherein the light reflective material component comprises light reflective material that is biocompatible for biological organisms.

A method disclosed herein may comprise steps comprising a photopolymerizable composition wherein the light reflective material component comprises light reflective material that polymerizes with at least one of a photopolymerizable macromer, a diluent, a light reflective material, or a combination thereof, or wherein the light reflective material component consists essentially of a light reflective material.

Disclosed herein is a polymer polymerized by methods disclosed herein and in photopolymerizable compositions disclosed herein. Disclosed herein is an article made by methods disclosed herein or from photopolymerizable compositions disclosed herein. Disclosed herein are articles made by methods disclosed herein or from photopolymerizable compositions disclosed herein which may be a medical device, or at least a portion of a medical device. In one aspect, the photopolymerizable composition is used as a medical device photopolymerized in situ. Some examples of medical devices may include but are not limited to device coatings, tissue adhesives, bone cements, void fillers, and drug eluting depots. Disclosed herein are articles made by methods disclosed herein and from photopolymerizable compositions disclosed herein wherein all of a portion of the article is porous, or wherein at least a portion or all of the article is biodegradable or is not under physiological conditions or wherein at least a portion or all of the article has a degradation rate of from about 3 days to about 5 years, or wherein at least a portion or all of the article is not biodegradable or wherein at least a portion or all of the article is drug-eluting. Disclosed herein are articles made by methods disclosed herein, or from photopolymerizable compositions disclosed herein, comprising photopolymerized biodegradable polymers and a nontoxic amount of photoinitiator.

Disclosed herein are articles made by methods disclosed herein, or from photopolymerizable compositions disclosed herein, comprising nontoxic polymer composition, comprising photopolymerized macromers and a non-toxic amount of photoinitiator. Such articles may further comprise photopolymerized diluent. Such articles may further comprise photopolymerized light reflective material. Such articles may have characteristics disclosed herein, and the article may be at least a portion or all of a medical device, or may be a coating on all or a portion of a medical device or a surface.

Disclosed herein are photopolymerizable compositions. For example, a photopolymerizable composition may at least one photopolymerizable macromer component; at least one light reflective material component comprising a light reflective material suspended in the composition; and at least one photoinitiator component; wherein the light reflective material component modulates the light dose of the composition when compared to the light dose of the composition without the light reflective material. In photopolymerizable compositions, a light reflective material component provides an increased polymerization rate at the surface of a photopolymerizable composition where the light contacts the composition in comparison to the same photopolymerizable composition without the light reflective material component. In photopolymerizable compositions incorporation of a light reflective material component into a photopolymerizable composition provides a surface cure of the macromer at a lower concentration of photoinitiator than the concentration used in the photopolymerizable composition without the light reflective material component. In photopolymerizable compositions, photoinitiator concentrations may be in a total concentration of less than 1.0 wt %. A disclosed photopolymerizable composition may comprise a reactive diluent or a nonreactive diluent, or both. A disclosed photopolymerizable composition may comprise a stabilizer, which may be a free radical stabilizer. A disclosed photopolymerizable composition may comprise a particulate light reflective material, which may comprise light reflective material that reflects UV light, visible light or both. A disclosed photopolymerizable composition may be heated or cooled. A photopolymerizable composition may comprise a reactive or nonreactive viscosity modifier to increase the viscosity.

A disclosed photopolymerizable composition may comprise an active agent. A disclosed photopolymerizable composition may comprise a light reflective material that is an active agent or a light reflective material that comprises an active agent. A disclosed photopolymerizable composition may comprise a photopolymerizable macromer component that comprises an active agent or a photopolymerizable macromer that comprises an active agent. A disclosed photopolymerizable composition may comprise a reactive diluent that comprises an active agent, or a nonreactive diluent that is an active agent. A disclosed photopolymerizable composition may comprise a dye. A disclosed photopolymerizable composition may comprise a photopolymerizable macromer component that comprises monomers with, or macromers with monomeric units (monomers), with ethylenically unsaturated groups, or comprises monomers with, or macromers with monomeric units (monomers), with thiol groups, or both. A disclosed photopolymerizable composition may comprise a photopolymerizable macromer component comprising macromers comprising monomeric units of at least one lactone monomer, glycolide, lactide, ε-caprolactone, trimethylene carbonate, p-dioxanone, 1,5-dioxepan-2-one, or a morpholine-2,5-dione, or combinations thereof.

A disclosed photopolymerizable composition may comprise a photopolymerizable composition that polymerizes when exposed to a light wavelength from 10 nm to 700 nm. (UV 10-400) (visible 390-700). A disclosed photopolymerizable composition may comprise a photopolymerizable composition photopolymerizes in a time that is faster than a photopolymerizable composition without the reflective material under the same polymerization conditions. A disclosed photopolymerizable composition may comprise a photopolymerizable composition photopolymerizes in a time that is faster than a photopolymerizable composition without the reflective material under the same polymerization conditions. A disclosed photopolymerizable composition may comprise a photopolymerizable composition photopolymerizes at a faster rate, at the same light exposure (mW/cm2) than a photopolymerizable composition without the reflective material under the same polymerization conditions. A disclosed photopolymerizable composition may comprise a photopolymerizable composition photopolymerizes at a faster rate, at the same light exposure (mW/cm2) than a photopolymerizable composition without the reflective material under the same polymerization conditions. A disclosed photopolymerizable composition may comprise a photoinitiator component is less than 1.00 wt % of the photopolymerizable composition. A disclosed photopolymerizable composition may comprise a photoinitiator that absorbs at a wavelength that is reflected by the light reflective material. A disclosed photopolymerizable composition may comprise a light reflective material component comprises light reflective material that polymerizes with at least one of a photopolymerizable macromer, a diluent, a light reflective material, or a combination thereof. A disclosed photopolymerizable composition may comprise a light reflective material component that consists of or consists essentially of a light reflective material.

A disclosed photopolymerizable composition may comprise a stereolithography photopolymerizable composition. A disclosed photopolymerizable composition may comprise a continuous liquid interface production photopolymerizable composition. A disclosed photopolymerizable composition may comprise a photopolymerizable ink composition. A photopolymerizable ink composition may comprise at least one photopolymerizable macromer component; at least one light reflective material component comprising a light reflective material suspended in the composition; at least one photoinitiator component; wherein the light reflective material component modulates the light dose of the composition when compared to the light dose of the composition without the light reflective material; a diluent; and a stabilizer.

A light reflective material disclosed herein may comprise at least one of an inorganic solid; an organic compound, a crystalline organic compound, a crystalline amino acid and/or its derivative, a crystalline fatty acids and/or its derivative, a crystalline peptide, or combinations thereof, such that when added to a photopolymerizable ink formulation, modulates the light dose requirement of the ink formulation, when compared to the light dose requirement of the ink formulation without the light reflective material. An inorganic compound light reflective material may comprise titanium dioxide, zinc oxide, barium sulfate, tricalcium phosphate, dicalcium phosphate, monocalcium phosphate, dicalcium diphosphate, calcium triphosphate, hydroxyapatite, apatite, and tetracalcium phosphate, or combinations thereof. An organic compound light reflective material may comprise aliphatic polymers and copolymers of polyesters, polyurethanes, polyethers, polyanhydrides, polyamides, polycarbonates, polyketones, polyethylene, polypropylene, polyvinyl alcohol, polytetrafluoroethylene, polyvinyl chloride, polyimides, and polyhydroxy alkanoates or combinations thereof. An organic compound light reflective material may comprise aromatic polymers and copolymers of polyesters, polyurethanes, polyethers, polyanhydrides, polyketones, polyamides, polycarbonates, and polyimides or combinations thereof. An organic compound light reflective material may comprise naturally derived polymers and derivatives of cyclodextrins, starch, hyaluronic acid, deacetylated hyaluronic acid, chitosan, trehalose, cellobiose, maltotriose, maltohexaose, chitohexaose, agarose, chitin 50, amylose, glucans, heparin, xylan, pectin, galactan, glycosaminoglycans, dextran, aminated dextran, cellulose, hydroxyalkylcelluloses, carboxyalkylcelluloses, fucoidan, chondroitin sulfate, sulfate polysaccharides, mucopolysaccharides, gelatin, zein, collagen, alginic acid, agar, carrageean, guar gum, gum arabic, gum ghatti, gum karaya, gum konjak, gum tamarind, gum tara, gum tragacanth, locust bean gum, pectins, xanthan gum and combinations thereof. A crystalline organic compound light reflective material may comprise crystalline aliphatic and aromatic polymers, and combinations thereof. A crystalline organic compound light reflective material may comprise crystalline naturally derived polymers and derivatives, and combinations thereof. A crystalline organic compound light reflective material may comprise crystalline amino acids and their derivatives, and combinations thereof. A crystalline organic compound light reflective material may comprise crystalline fatty acids, including but not limited to, palmitic acid, ascorbyl palmitate, lauric acid, glycerol monolaurate, myristic aid, capric acid, and combinations thereof. In one aspect, the light reflective material is not soluble in the macromer formulation. In one aspect, the light reflective material does not swell in the macromer formulation.

The present disclosure is further illustrated by the examples contained herein, which are not to be construed in any way as imposing limitations upon the scope thereof. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims.

EXAMPLES

Example 1: Preparation of Photopolymerizable Formulations

Photopolymerizable formulations were synthesized by mixing a macromer, photoinitiator, light reflective material, dye, and reactive diluent outlined in Table 1. Examples of macromers used in the following examples were polyester dimethacrylate (PEDMA; $M_n$=2,500 Da; 6,750 cP) and polyethylene glycol diacrylate (PEGDA; $M_n$=575, 57 cP). The photoinitiator used were 2,4,6-trimethylbenzoylphenyl phosphinate (Irgacure® TPO-L) and 2-hydroxy-1-[4-(2-hydroxyethoxy) phenyl]-2-methyl-1-propanone (Irgacure® 2959). The UV reflective material particulate described below for these formulations were barium sulfate microparticles (BaSO$_4$; 1-3µ), polyglycolide microparticles (PGA; <10µ), absorbable phosphate ceramic microparticles (PHC), amorphous polylactide copolymer microparticles (ACPLA; <75 µm) and semi-crystalline polylactide microparticles (PLA; <75 µm). The dye utilized in these example formulations was D&C Green 6. The reactive diluent outlined in Table 1 is polyethylene glycol diacrylate (57 cP). Most of these components were commercially available, for example, from Millipore-Sigma, 28820 Single Oak Drive, Temecula, California 92590, United States of America.

For the formulation number 20, 1 g of PEDMA, 1 g of PEGDA, 0.4 g barium sulfate, and 0.086 g Irgacure® TPO-L were weighed into an opaque container. The formulation was stirred until all of the components were thoroughly mixed and homogenous.

From Table 2, the formulations with macromer and photoinitiator only achieved surface cure at a light dose of 30 mJ/cm² and photoinitiator concentration of 7.4 wt. % in

TABLE 1

Photopolymerizable Formulation Composition

| Formulation Number | Macromer Material (M) | Photoinitiator Material (P) | Light Reflective Material (U) | Dye Material (D) | Reactive Diluent (RD) | Composition (wt. %) | | | | |
|---|---|---|---|---|---|---|---|---|---|---|
| | | | | | | M | P | U | D | RD |
| 1 | PEDMA | TPO-L | ... | ... | ... | 99.3 | 0.7 | ... | ... | ... |
| 2 | PEDMA | TPO-L | ... | ... | ... | 98.7 | 1.2 | ... | ... | ... |
| 3 | PEDMA | TPO-L | ... | ... | ... | 97.9 | 2.1 | ... | ... | ... |
| 4 | PEDMA | TPO-L | ... | ... | ... | 96.2 | 3.8 | ... | ... | ... |
| 5 | PEDMA | TPO-L | ... | ... | ... | 92.6 | 7.4 | ... | ... | ... |
| 6 | PEDMA | TPO-L | ... | Green 6 | ... | 99.2 | 0.6 | ... | 0.1 | ... |
| 7 | PEDMA | TPO-L | ... | Green 6 | ... | 98.6 | 1.3 | ... | 0.1 | ... |
| 8 | PEDMA | TPO-L | ... | Green 6 | ... | 97.9 | 2.0 | ... | 0.1 | ... |
| 9 | PEDMA | TPO-L | ... | Green 6 | ... | 95.9 | 4.0 | ... | 0.1 | ... |
| 10 | PEDMA | TPO-L | ... | Green 6 | ... | 92.4 | 7.5 | ... | 0.1 | ... |
| 11 | PEDMA | TPO-L | BaSO$_4$ | ... | ... | 82.8 | 0.6 | 16.6 | ... | ... |
| 12 | PEDMA | TPO-L | BaSO$_4$ | ... | ... | 82.6 | 0.9 | 16.4 | ... | ... |
| 13 | PEDMA | TPO-L | BaSO$_4$ | ... | ... | 81.9 | 1.7 | 16.4 | ... | ... |
| 14 | PEDMA | TPO-L | BaSO$_4$ | ... | ... | 80.6 | 3.3 | 16.2 | ... | ... |
| 15 | PEDMA | TPO-L | BaSO$_4$ | ... | ... | 78.1 | 6.3 | 15.6 | ... | ... |
| 16 | PEDMA | TPO-L | BaSO$_4$ | ... | PEGDA | 40.1 | 0.2 | 17.1 | ... | 41.7 |
| 17 | PEDMA | TPO-L | BaSO$_4$ | ... | PEGDA | 41.4 | 0.4 | 16.7 | ... | 41.4 |
| 18 | PEDMA | TPO-L | BaSO$_4$ | ... | PEGDA | 41.1 | 0.8 | 16.6 | ... | 41.5 |
| 19 | PEDMA | TPO-L | BaSO$_4$ | ... | PEGDA | 40.6 | 1.7 | 16.4 | ... | 41.3 |
| 20 | PEDMA | TPO-L | BaSO$_4$ | ... | PEGDA | 40.1 | 3.4 | 16.1 | ... | 40.4 |
| 21 | PEDMA | TPO-L | PGA | ... | ... | 82.9 | 0.6 | 16.5 | ... | ... |
| 22 | PEDMA | TPO-L | PGA | ... | ... | 82.7 | 0.8 | 16.5 | ... | ... |
| 23 | PEDMA | TPO-L | PGA | ... | ... | 81.9 | 1.7 | 16.4 | ... | ... |
| 24 | PEDMA | TPO-L | PGA | ... | ... | 80.6 | 3.3 | 16.1 | ... | ... |
| 25 | PEDMA | TPO-L | PGA | ... | ... | 78.1 | 6.3 | 15.6 | ... | ... |
| 26 | PEDMA | TPO-L | PHC | ... | ... | 82.9 | 0.4 | 16.7 | ... | ... |
| 27 | PEDMA | TPO-L | PHC | ... | ... | 82.4 | 1.2 | 16.5 | ... | ... |
| 28 | PEDMA | TPO-L | PHC | ... | ... | 81.8 | 1.7 | 16.5 | ... | ... |
| 29 | PEDMA | TPO-L | PHC | ... | ... | 80.7 | 3.2 | 16.1 | ... | ... |
| 30 | PEDMA | TPO-L | PHC | ... | ... | 78.0 | 6.3 | 15.8 | ... | ... |
| 31 | PEDMA | TPO-L | PGA | ... | PEGDA | 41.7 | 0.0 | 16.6 | ... | 41.6 |
| 32 | PEDMA | TPO-L | PGA | ... | PEGDA | 41.2 | 0.1 | 16.7 | ... | 41.9 |
| 33 | PEDMA | TPO-L | PGA | ... | PEGDA | 41.6 | 0.2 | 16.7 | ... | 41.6 |
| 34 | PEDMA | TPO-L | PGA | ... | PEGDA | 41.2 | 0.4 | 16.6 | ... | 41.7 |
| 35 | PEDMA | TPO-L | PGA | ... | PEGDA | 41.2 | 0.8 | 16.6 | ... | 41.4 |
| 36 | PEDMA | I2959 | PGA | ... | PEGDA | 41.6 | 0.2 | 16.7 | ... | 41.6 |
| 37 | PEDMA | I2959 | PGA | ... | PEGDA | 41.3 | 0.4 | 17.0 | ... | 41.3 |
| 38 | PEDMA | I2959 | PGA | ... | PEGDA | 41.0 | 0.9 | 17.1 | ... | 41.0 |
| 39 | PEDMA | TPO-L | PGA | ... | ... | 83.0 | 0.2 | 16.8 | ... | ... |
| 40 | PEDMA | TPO-L | PGA | ... | ... | 71.7 | 0.1 | 28.1 | ... | ... |
| 41 | PEDMA | TPO-L | PGA | ... | ... | 61.8 | 0.1 | 38.0 | ... | ... |
| 42 | PEDMA | TPO-L | ACPLA | ... | ... | 83.0 | 0.2 | 16.8 | ... | ... |
| 43 | PEDMA | TPO-L | PLA | ... | ... | 83.2 | 0.2 | 16.6 | ... | ... |

Example 2: Surface Cure of Photopolymerizable Formulations

The example formulations from Table 1 were photopolymerized with a Dymax BlueWave® 200 under a constant distance from the light source. Prior to photopolymerization, the light intensity was set to 3 mW/cm² through measurement with a UVA detector. Each formulation was photopolymerized for a set time, and the overall light dosing or light exposure was calculated by multiplying the light intensity by the time light was applied. After the light dosing, the samples were examined and graded. The samples could be described by 0 (still flowing), 1 (increase in viscosity; indications of partially cured film), and 2 (surface film layer). Some photopolymerized films increased in layer thickness with time after initial surface cure. However, each of those samples were scored a 2. In Table 2, the scoring for the surface cure experiments are outlined.

formulation number 5. The addition of 0.1% of D&C Green #6 had no change on the concentration of photoinitiator needed to achieve surface cure of the polymer. However, with the addition of barium sulfate as a light reflective material, composition achieved surface cure in formulation number 11 at a photoinitiator concentration of 0.6%. In formulation number 16, which used a 50:50 ratio of macromer to reactive diluent, the formulation achieved surface curing at a concentration of 0.2% and at half the light dose (15 mJ/cm²) of previous formulations. As observed here, substantial decreases in photoinitiator are possible through the addition of the light reflective material. Other materials such as polyglycolide microparticles and absorbable phosphate ceramic microparticles were capable of repeating the substantial reduction of photoinitiator and half the light dosing.

TABLE 2

Evaluation of Photopolynnerizable Formulation Surface Curing

| Formulation Number | Composition (wt. %) | | | | | Light Intensity, mW/cm$^2$ | Light Duration, s | Light Dosing/ Exposure, mJ/cm$^2$ | Qualitative Surface Cure Score |
|---|---|---|---|---|---|---|---|---|---|
| | M | P | U | D | RD | | | | |
| 1 | 99.3 | 0.7 | ... | ... | ... | 3 | 10 | 30 | 0 |
| 2 | 98.7 | 1.2 | ... | ... | ... | 3 | 10 | 30 | 0 |
| 3 | 97.9 | 2.1 | ... | ... | ... | 3 | 10 | 30 | 0 |
| 4 | 96.2 | 3.8 | ... | ... | ... | 3 | 10 | 30 | 1 |
| 5 | 92.6 | 7.4 | ... | ... | ... | 3 | 10 | 30 | 2 |
| 6 | 99.2 | 0.6 | ... | 0.1 | ... | 3 | 10 | 30 | 0 |
| 7 | 98.6 | 1.3 | ... | 0.1 | ... | 3 | 10 | 30 | 0 |
| 8 | 97.9 | 2.0 | ... | 0.1 | ... | 3 | 10 | 30 | 0 |
| 9 | 95.9 | 4.0 | ... | 0.1 | ... | 3 | 10 | 30 | 1 |
| 10 | 92.4 | 7.5 | ... | 0.1 | ... | 3 | 10 | 30 | 2 |
| 11 | 82.8 | 0.6 | 16.6 | ... | ... | 3 | 10 | 30 | 2 |
| 12 | 82.6 | 0.9 | 16.4 | ... | ... | 3 | 10 | 30 | 2 |
| 13 | 81.9 | 1.7 | 16.4 | ... | ... | 3 | 10 | 30 | 2 |
| 14 | 80.6 | 3.3 | 16.2 | ... | ... | 3 | 10 | 30 | 2 |
| 15 | 78.1 | 6.3 | 15.6 | ... | ... | 3 | 10 | 30 | 2 |
| 16 | 40.1 | 0.2 | 17.1 | ... | 41.7 | 3 | 5 | 15 | 2 |
| 17 | 41.4 | 0.4 | 16.7 | ... | 41.4 | 3 | 5 | 15 | 2 |
| 18 | 41.1 | 0.8 | 16.6 | ... | 41.5 | 3 | 5 | 15 | 2 |
| 19 | 40.6 | 1.7 | 16.4 | ... | 41.3 | 3 | 5 | 15 | 2 |
| 20 | 40.1 | 3.4 | 16.1 | ... | 40.4 | 3 | 5 | 15 | 2 |
| 21 | 82.9 | 0.6 | 16.5 | ... | ... | 3 | 5 | 15 | 2 |
| 22 | 82.7 | 0.8 | 16.5 | ... | ... | 3 | 5 | 15 | 2 |
| 23 | 81.9 | 1.7 | 16.4 | ... | ... | 3 | 5 | 15 | 2 |
| 24 | 80.6 | 3.3 | 16.1 | ... | ... | 3 | 5 | 15 | 2 |
| 25 | 78.1 | 6.3 | 15.6 | ... | ... | 3 | 5 | 15 | 2 |
| 26 | 82.9 | 0.4 | 16.7 | ... | ... | 3 | 5 | 15 | 2 |
| 27 | 82.4 | 1.2 | 16.5 | ... | ... | 3 | 5 | 15 | 2 |
| 28 | 81.8 | 1.7 | 16.5 | ... | ... | 3 | 5 | 15 | 2 |
| 29 | 80.7 | 3.2 | 16.1 | ... | ... | 3 | 5 | 15 | 2 |
| 30 | 78.0 | 6.3 | 15.8 | ... | ... | 3 | 5 | 15 | 2 |
| 31 | 41.7 | 0.06 | 16.6 | ... | 41.6 | 3 | 5 | 15 | 0 |
| 32 | 41.2 | 0.11 | 16.7 | ... | 41.9 | 3 | 5 | 15 | 0 |
| 33 | 41.6 | 0.2 | 16.7 | ... | 41.6 | 3 | 5 | 15 | 1 |
| 34 | 41.2 | 0.4 | 16.6 | ... | 41.7 | 3 | 5 | 15 | 2 |
| 35 | 41.2 | 0.8 | 16.6 | ... | 41.4 | 3 | 5 | 15 | 2 |
| 36 | 41.6 | 0.2 | 16.7 | ... | 41.6 | 3 | 10 | 30 | 0 |
| 37 | 41.3 | 0.4 | 17.0 | ... | 41.3 | 3 | 10 | 30 | 0 |
| 38 | 41.0 | 0.9 | 17.1 | ... | 41.0 | 3 | 10 | 30 | 1 |

Example 3: Surface Cure of SLA Formulations for Variable Exposure Times

The example formulations numbers 39 to 43 from Table 1 were photopolymerized with a Dymax BlueWave® 200 under a constant distance from the light source, for variable exposure times. Prior to photopolymerization, the light intensity was set to 3 mW/cm$^2$ through measurement with a UVA detector. Samples of each formulation were photopolymerized for 1.3, 2.5, 5.0 and 10 s. A UVA detector was placed under a glass petri dish, and the light dosage after the exposure duration was recorded before adding the sample on it. The sample on the petri dish was photopolymerized for one of the above-mentioned durations and the dosage of light transmitted through the sample to the UV detector was recorded. A decrease in light dosage recorded by the UVA detector was observed with increase in the amount of light reflective material in the formulation as well as increased exposure time. Similarly, the sample with higher amount of crystalline light reflective materials cured faster than their counterparts with amorphous polymer microparticle dispersions. The photopolymerized formulations were also qualitatively graded based on the rating system described in Example 2.

TABLE 3

Evaluation of Photopolynnerizable Formulation Surface Curing for Variable Exposure Time

| Formulation Number | Composition (wt. %) | | | Light Duration, s | Light Dosing through Empty Petridish, mJ/cm$^2$ | Light Dosing Through Formulation, mJ/cm$^2$ | Qualitative Surface Cure Score |
|---|---|---|---|---|---|---|---|
| | M | P | U | | | | |
| 39 | 83.0 | 0.22 | 16.8 | 1.3 | 6 | 5 | 0 |
| | | | | 2.5 | 9 | 6 | 1 |
| | | | | 5.0 | 19 | 12 | 2 |
| | | | | 10 | 37 | 18 | 2 |

TABLE 3-continued

Evaluation of Photopolymerizable Formulation Surface Curing for Variable Exposure Time

| Formulation Number | Composition (wt. %) | | | Light Duration, s | Light Dosing through Empty Petridish, mJ/cm² | Light Dosing Through Formulation, mJ/cm² | Qualitative Surface Cure Score |
|---|---|---|---|---|---|---|---|
| | M | P | U | | | | |
| 40 | 71.7 | 0.19 | 28.1 | 1.3 | 5 | 4 | 0 |
| | | | | 2.5 | 10 | 5 | 2 |
| | | | | 5.0 | 18 | 12 | 2 |
| | | | | 10 | 35 | 20 | 2 |
| 41 | 61.8 | 0.17 | 38.0 | 1.3 | 5 | 3 | 2 |
| | | | | 2.5 | 9 | 5 | 2 |
| | | | | 5.0 | 18 | 9 | 2 |
| | | | | 10 | 36 | 14 | 2 |
| 42 | 83.0 | 0.22 | 16.8 | 1.3 | 5 | 4 | 0 |
| | | | | 2.5 | 9 | 7 | 0 |
| | | | | 5.0 | 19 | 15 | 0 |
| | | | | 10 | 36 | 31 | 1 |
| 43 | 83.2 | 0.22 | 16.6 | 1.3 | 5 | 3 | 1 |
| | | | | 2.5 | 9 | 7 | 1 |
| | | | | 5.0 | 18 | 13 | 1 |
| | | | | 10 | 35 | 28 | 2 |

Example 4: Printing Photopolymerizable Formulation Articles

A three dimensional object was created in Solidworks® of a rectangular cuboid. The three dimensional object file was converted to a STL file. The formulation number 33 was added to the ink bed of a B9 Creator v1.2 SLA printer (B9Creations, LLC, 525 University Loop, Suite 115, Rapid City, SD 57701). The object was printed at a 30 µm layer thickness with an exposure time of 6 s for the first two layers and 3 s for subsequent layers. The light intensity of the SLA printer was 3 mW/cm² when measured by a UVA detector.

Example 5: Photo-Printing with and without Reflective Material

Presence of light reflective material decreases the time of exposure to light required by the polymer resin to completely cure and hence, decreasing the total time required to photoprint a part.

Two resin blends were made, comprising formulation number 5 from Examples 1 and 2, (a custom-made dimethacrylate linear polymer of Mn=2300 Da comprising trimethylene carbonate, caprolactone and glycolide monomers) and PEG-DA 575 (Sigma Aldrich) in a 50/50 (w/w) ratio and each was combined with 0.5% Phenylbis(2,4,6-trimethylbenzoyl)phosphine oxide (BAPO) photoinitiator and 0.025% D&C Violet dye in weight percent to the base polymer blend. One blend was mixed with 25% poly(glycolide) microparticles as a light reflective material. Both resins were used to print rectangular strips (75×7.5×1 mm) of with a layer thickness of 50 µm and exposure time of 1.75 seconds on B9 Creator DLP printer. While the parts printed with resin with the light reflective material were completely cured with these printing parameters, those without the light reflective material were tacky to the touch and therefore insufficiently cured. Prints made with resin that did not contain light reflective material were repeated with increased exposure time from 1.75 seconds to 7 seconds. At this time point, the articles made with resin not comprising light reflective material were comparable to the article made with resin comprising the reflective component at 1.75 seconds. The incorporation of light reflective material therefore allowed for a low photoinitiator concentration and a reduced print time by a factor of 4.

Example 6: Printed Article

A donut-shaped (annular) printed article was designed in Solid Works 2016 with a 10 mm outer diameter, 5 mm inner diameter, and 3 mm height. A resin blend of formulation number 5 of Examples 1 and 2, and PEG-DA 575 in a 50/50 (w/w) ratio was combined with 25 wt % particulate polyglycolide as light reflective materials (particle size 5-20 µm), 0.25% BAPO photoinitiator, and 0.025% D&C Violet in weight percent to the base polymer blend. A part was printed using the Wanhao Duplicator 7 masked-DLP printer, subsequently rinsed in toluene, and measured with calipers.

TABLE 3

Target and actual dimensions a 3D printed ring structure using Formulation number 5 (above in Ex 1 and 2) based resin formulation

| Dimension | Target (mm) | Actual (mm) | Percent Difference |
|---|---|---|---|
| Outer Diameter | 10 | 10.02 | 0.20% |
| Inner Diameter | 5 | 5.16 | 3.20% |
| Height | 3 | 3.09 | 3.00% |

Hydrogels

Formulations of poly(ethylene glycol)diacrylate (MW=575 Da) in deionized (DI) water were prepared at a 5% (w/w) concentration with or without additives. Additives included PEG 12000 for viscosity and nylon microparticles as light reflective material. All formulations included Irgacure 651 photoinitiator at a 0.5% concentration (w/w) with respect to the total weight of the acrylated polymer component. Table 4 presents the groups included in the study.

TABLE 4

PEG-DA in DI Water formulations for hydrogel formation experiments.
Percentage of PEG-DA and PEG with respect to their solution
in DI water. Percentage of nylon is based on the weight of the
total weight of PEG-DA + PEG + water solution. Percentage
of photoinitiator (PI) is based on the weight of PEG-DA

| Name | % PEG-DA 575 | % PEG 12000 | % Nylon microparticles | % PI |
|---|---|---|---|---|
| Formulation 1 | 10 | 0 | 0 | 0.5 |
| Formulation 2 | 10.20 | 4.99 | 0 | 0.51 |
| Formulation 3 | 10.17 | 9.98 | 0 | 0.52 |
| Formulation 4 | 10.20 | 4.99 | 24.92 | 0.51 |
| Formulation 5 | 10.17 | 9.98 | 24.96 | 0.52 |

A small volume of each sample was placed in a petri dish, constrained within a 20 mm diameter ring of silicone grease, and exposed to UV light source (Dymax Blue Wave 200 UV light curing spot lamp system) with an intensity of 30 mW/cm$^2$ measured with the Dymax intensity meter. All samples were exposed to the UV light in a range of 1 to 5 seconds and scored based on the level of crosslinking achieved as observed visually and by touch. Table 5 presents the scoring parameters.

TABLE 5

Scoring method for samples after being cured by UV light

| Score | Physical parameters of the formulation post light exposure |
|---|---|
| 0 | No change |
| 1 | Fluid present; delicate to touch; potentially cured at the surface |
| 2 | Stiffness; no fluid; partially cured |
| 3 | Very stiff; Through cured |

TABLE 6

Scores of samples (based on table 5) after
exposing them to UV light for 1-3 seconds.

| Formulations | Cure times | | |
|---|---|---|---|
| | 1 s | 3 s | 5 s |
| Formulation 1 | 0 | 2 | 2 |
| Formulation 2 | 1 | 2 | 3 |
| Formulation 3 | 1 | 2 | 3 |
| Formulation 4 | 1 | 2 | 3 |
| Formulation 5 | 1 | 3 | 3 |

While not much difference in the rate of crosslinking was observed when 5% nylon particles were added to the formulation, an addition of 25% nylon microparticles induced faster curing in the samples as indicated by the increased stiffness at a lower exposure time.

Example 7: Photocuring Formulation Number 5/PEG-DA575 Blend with β-Tricalcium Phosphate (TCP) as Reflective Material Photocurable formulations were prepared of a blend of methacrylated formulation number 5 of Examples 1 and 2 (a custom-made dimethacrylate linear polymers of Mn=2300 Da comprising trimethylene carbonate, caprolactone and glycolide monomers) and PEG-DA575 (Sigma Aldrich) at a 50:50 weight percent ratio and 0.25% (w/w) of BAPO as photoinitiator, with and without 25% (w/w) of TCP. Both formulations were exposed to UV light (Dymax Blue Wave 200 UV light curing spot lamp system) at an intensity of 30 mW/cm$^2$ for a 0.2, 0.5 and 1 s durations. The formulation without TCP did not start to partially cure till 0.5 s and formed a surface cured skin at 1 s. In contrast, the formulation containing 25% TCP cured at the surface at 0.2 s and was almost through cured at 1 s, indicating an increase in rate of curing with the addition of TCP.

What is claimed is:

1. A method for photopolymerization printing an article comprising,
   a) exposing for a time with light, a photopolymerizable composition comprising
      i. at least one photopolymerizable macromer component;
      ii. at least one light reflective material component suspended in the photopolymerizable composition; and
      ii. at least one photoinitiator component, wherein the photoinitiator component is in a total concentration of less than 1.0 wt. %;
   wherein the light reflective material component modulates a light dose requirement of the photopolymerizable composition when compared to the light dose requirement of the composition without the light reflective material;
   and
   b) forming a printed article comprising at least polymerized macromers.

2. The method of claim 1, wherein the light reflective material component provides an increased polymerization rate at a surface of a photopolymerizable composition where the light contacts the composition in comparison to the same photopolymerizable composition without the light reflective material component.

3. The method of claim 1, wherein incorporation of a light reflective material component into a photopolymerizable composition provides a surface cure of the macromer at a lower concentration of photoinitiator than the concentration used in the photopolymerizable composition without the light reflective material component.

4. The method of claim 1, wherein the photopolymerizable composition further comprises at least one of a reactive diluent, a nonreactive diluent, or both a reactive diluent and a nonreactive diluent, an active agent, a dye, or a stabilizer.

5. The method of claim 1, wherein the light reflective material component comprises a particulate light reflective material.

6. The method of claim 1, further comprising a secondary curing step comprising curing the printed article.

7. The method of claim 1, wherein the photopolymerizable macromer component comprises one or more ethylenically unsaturated groups or one or more thiol groups.

8. The method of claim 1, wherein the photopolymerizable macromer component comprises macromers comprising monomeric units of at least one lactone monomer, glycolide, lactide, ε-caprolactone, trimethylene carbonate, p-dioxanone, 1,5-dioxepan-2-one, or a morpholine-2,5-dione, or combinations thereof.

9. A polymer polymerized by the method of claim 1.

10. An article produced by the method of claim 1.

11. A photopolymerizable composition, comprising
   a. at least one photopolymerizable macromer component;
   b. at least one light reflective material component comprising a light reflective material suspended in the photopolymerizable composition; and
   c. at least one photoinitiator component, wherein the photoinitiator component is in a total concentration of less than 1.0 wt %;

wherein the light reflective material component modulates a light dose requirement of the photopolymerizable composition when compared to the light dose requirement of the photopolymerizable composition without the light reflective material.

12. The composition of claim 11, wherein the photopolymerizable composition further comprises at least one of a reactive diluent, a nonreactive diluent, or both a reactive diluent and a nonreactive diluent, a stabilizer, a dye, or an active agent.

13. The composition of claim 11, where in the light reflective material component comprises a particulate light reflective material.

14. The composition of claim 11, wherein the light reflective material is an active agent, the light reflective material comprises an active agent, or the photopolymerizable macromer component comprises an active agent.

15. The composition of claim 11 wherein the photopolymerizable macromer component comprises:
monomers with, or macromers with monomeric units (monomers), with ethylenically unsaturated groups, or
monomers with, or macromers with monomeric units (monomers), with thiol groups, or
combinations of monomers with, or macromers with monomeric units (monomers), with ethylenically unsaturated groups and monomers with, or macromers with monomeric units (monomers), with thiol groups.

16. The composition of claim 11, wherein the photopolymerizable macromer component comprises macromers comprising monomeric units of at least one lactone monomer, glycolide, lactide, ε-caprolactone, trimethylene carbonate, p-dioxanone, 1,5-dioxepan-2-one, or a morpholine-2,5-dione, or combinations thereof.

17. The composition of claim 11, wherein the light reflective material component comprises light reflective material that polymerizes with at least one of a photopolymerizable macromer, a diluent, a light reflective material, or a combination thereof.

18. A light reflective material, comprising, at least one of an inorganic solid; an organic compound, a crystalline organic compound, a crystalline amino acid and/or its derivative, a crystalline fatty acids and/or its derivative, a crystalline peptide, or combinations thereof, such that when added to a photopolymerizable ink formulation, modulates a light dose requirement of the ink formulation, when compared to the light dose requirement of the ink formulation without the light reflective material.

* * * * *